United States Patent
Lee et al.

(10) Patent No.: US 9,748,261 B2
(45) Date of Patent: Aug. 29, 2017

(54) METHOD OF FABRICATING MEMORY DEVICE

(71) Applicants: Jae-goo Lee, Suwon-si (KR);
Young-woo Park, Cheonan-si (KR)

(72) Inventors: Jae-goo Lee, Suwon-si (KR);
Young-woo Park, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/832,285

(22) Filed: Aug. 21, 2015

(65) Prior Publication Data

US 2016/0093637 A1    Mar. 31, 2016

(30) Foreign Application Priority Data

Sep. 29, 2014 (KR) .................. 10-2014-0130334

(51) Int. Cl.
| | |
|---|---|
| *H01L 21/336* | (2006.01) |
| *H01L 27/11582* | (2017.01) |
| *H01L 21/28* | (2006.01) |
| *H01L 27/11575* | (2017.01) |

(52) U.S. Cl.
CPC .. *H01L 27/11582* (2013.01); *H01L 21/28282* (2013.01); *H01L 27/11575* (2013.01)

(58) Field of Classification Search
CPC ......... H01L 27/11582; H01L 27/11575; H01L 21/28282; H01L 21/31111; H01L 29/42364; H01L 29/7926
USPC ........................................ 438/269
See application file for complete search history.

(56) References Cited

U.S. PATENT DOCUMENTS

| | | | |
|---|---|---|---|
| 8,455,940 B2 | 6/2013 | Lee et al. | |
| 8,704,288 B2 | 4/2014 | Lee et al. | |
| 8,717,814 B2 | 5/2014 | Choi et al. | |
| 2005/0067651 A1* | 3/2005 | Kim | ............. B82Y 10/00 257/314 |
| 2010/0195395 A1* | 8/2010 | Jeong | ............. G11C 16/0483 365/185.17 |
| 2012/0228697 A1* | 9/2012 | Youm | ............. H01L 29/7926 257/329 |
| 2013/0001744 A1 | 1/2013 | Kim | |

(Continued)

FOREIGN PATENT DOCUMENTS

| | | |
|---|---|---|
| JP | 2014022430 A | 2/2014 |
| KR | 20020096610 A | 12/2002 |

(Continued)

*Primary Examiner* — Trung Q Dang
(74) *Attorney, Agent, or Firm* — Harness, Dickey & Pierce, P.L.C.

(57) ABSTRACT

A method of fabricating a memory device includes alternately stacking a plurality of insulating layers and a plurality of sacrificial layers on a substrate, forming a channel hole by etching the insulating layers and the sacrificial layers to expose a partial region of the substrate, forming a channel structure in the channel hole, forming an opening by etching the insulating layers and the sacrificial layers to exposed a portion of the substrate, forming a plurality of side openings that include first side openings and a second side opening by removing the sacrificial layers through the opening, forming gate electrodes to fill the first side openings, and forming a blocking layer to fill the second side opening.

13 Claims, 33 Drawing Sheets

(56) References Cited

U.S. PATENT DOCUMENTS

| | | | |
|---|---|---|---|
| 2013/0009236 A1* | 1/2013 | Lee | H01L 27/11556 257/329 |
| 2013/0148398 A1 | 6/2013 | Baek et al. | |
| 2013/0270631 A1* | 10/2013 | Kim | H01L 29/7827 257/331 |
| 2013/0334702 A1 | 12/2013 | Lee | |
| 2014/0070302 A1* | 3/2014 | Yoo | H01L 27/1157 257/324 |

FOREIGN PATENT DOCUMENTS

| | | |
|---|---|---|
| KR | 101055855 B1 | 8/2011 |
| KR | 20130139610 A | 12/2013 |
| KR | 20140017219 A | 2/2014 |

* cited by examiner

METHOD OF FABRICATING MEMORY DEVICE

CROSS-REFERENCE TO RELATED APPLICATION

This application claims priority under 35 U.S.C. §119 to Korean Patent Application No. 10-2014-0130334, filed on Sep. 29, 2014, in the Korean Intellectual Property Office, the disclosure of which is incorporated herein in its entirety by reference.

BACKGROUND

The present disclosure relates to a method of fabricating a memory device, and more particularly, to a method of fabricating a memory device using a sacrificial layer.

In recent years, as information communication devices have become more multi-functional, the demand for large-capacity highly integrated memory devices has increased. Also, as memory cells have been downscaled to increase integration density, operating circuits and/or interconnection structures included in memory devices to enable operations and electrical connection of the memory devices have become increasingly complicated. Thus, memory devices capable of improving the integration density of memory devices and having good electrical properties are required.

SUMMARY

The present disclosure relates to a method of fabricating a memory device, which have excellent electrical properties and high reliability.

According to example embodiments of inventive concepts, a method of fabricating a memory device is provided. The method includes alternately stacking a plurality of insulating layers and a plurality of sacrificial layers on a substrate, forming a channel hole by etching the insulating layers and the sacrificial layers to expose a partial region of the substrate, forming a channel structure in the channel hole, forming an opening by etching the insulating layers and the sacrificial layers to expose a partial region of the substrate, forming a plurality of side openings by removing the sacrificial layers through the opening, the side openings including first side openings and a second side opening, forming gate electrodes that fill the first side openings, and forming a blocking layer that fills the second side opening.

In example embodiments, a thickness of the blocking layer in a first direction may be greater than a thickness of each of the gate electrodes in the first direction. The first direction may be perpendicular to a top surface of the substrate.

In example embodiments, the method may further include forming an upper insulating structure to cover a top surface of an uppermost insulating layer of the insulating layers and a top surface of the channel structure, forming a bit line contact that is connected to the channel structure through the upper insulating layer, and forming a bit line on the upper insulating structure. The bit line may be connected to the bit line contact. A top surface of the blocking layer may be at a lower level than a bottom surface of the bit line contact.

In example embodiments, the blocking layer may have a high etch selectivity with respect to the insulating layers and the upper insulating structure.

In example embodiments, the method may further include forming gate contacts that may be connected to the gate electrodes, respectively. The gate contacts may be spaced apart from the blocking layer.

In example embodiments, the gate contacts may include a string selection line contact, a word line contact, and a ground selection line contact. The string selection line contact may be in contact with the blocking layer. The word line contact and the ground selection line contact may be spaced apart from the blocking layer.

In example embodiments, the method may further include forming a common source line structure that fills the opening.

In example embodiments, the sacrificial layers may include first sacrificial layers and a second sacrificial layer. The second sacrificial layer may be on an uppermost first sacrificial layer of the first sacrificial layers. A thickness of the second sacrificial layer in the first direction may be greater than a thickness of each of the first sacrificial layers in the first direction.

According to example embodiments of inventive concepts, a method of fabricating a memory device is provided. The method includes forming a stack structure on a substrate, the stack structure including a plurality of first sacrificial layers respectively interposed between a plurality of insulating layers, forming a second sacrificial layer on a top insulating layer among the insulating layers, the top insulating layer exposed at a top portion of the stack structure, forming a channel hole by etching the insulating layers, the first sacrificial layers, and the second sacrificial layer to expose a partial region of the substrate, forming a channel structure in the channel hole, forming an opening by etching the insulating layers, the first sacrificial layers, and the second sacrificial layer to expose a portion of the substrate, forming first side openings by removing the first sacrificial layers through the opening, forming gate electrodes that fill the first side openings, forming a second side opening by removing the second sacrificial layer, and forming a blocking layer that fills the second side opening.

In example embodiments, the second sacrificial layer may have a high etch selectivity with respect to the first sacrificial layers. Also, the second sacrificial layer may have a high etch selectivity with respect to the gate electrodes.

In example embodiments, a thickness of the second sacrificial layer in a first direction may be smaller than a thickness of each of the first sacrificial layers in the first direction. Also, a thickness of the blocking layer in the first direction perpendicular may be smaller than a thickness of each of the gate electrodes obtained in the first direction. The first direction may be perpendicular to the substrate.

According to example embodiments of inventive concepts, there is provided a method of fabricating a memory device. The method includes alternately stacking a plurality of insulating layers and a plurality of sacrificial layers on a substrate, forming a channel structure to penetrate the insulating layers and the sacrificial layers disposed in a cell area, forming a plurality of side openings by removing the sacrificial layers, forming gate electrodes in side openings except for an uppermost side opening of the side openings, and forming a blocking layer in the uppermost side opening.

In example embodiments, the formation of the gate electrodes may include forming a gate layer to cover the side openings and removing the gate layer formed from a region of the uppermost side opening of the side openings. The removal of the gate layer may be performed using a wet etching process.

In example embodiments, the blocking layer may have a high etch selectivity with respect to the gate electrodes. A top surface of the blocking layer may have a smaller planar area than a top surface of each of the gate electrodes.

According to example embodiments, a method of fabricating a memory device may include forming a plurality of memory cell strings on a substrate and forming a blocking layer. The memory cell strings may include a plurality of gate electrodes and insulating layers alternately stacked on each other on the substrate. The gate electrodes and the insulating layers define channel holes that are spaced apart from each other and expose a partial region of the substrate. The gate electrodes and the insulating layer define an opening that exposes a portion of the substrate. The memory cell strings include a plurality of channel structures that extend vertically through the channel holes to a height above the gate electrodes. The blocking layer is formed on the gate electrodes and insulating layers. The blocking layer contacts a sidewall of the channel structures. The blocking layer includes a material that is different than a material of the insulating layers.

In example embodiments, the blocking layer may be spaced apart from the gate electrodes and the insulating layers in the vertical direction, and a thickness of the blocking layer may be different than a thickness of the gate electrodes.

In example embodiments, the blocking layer may include at least one of aluminum oxide, hafnium oxide, silicon nitride, boron nitride, and silicon carbide. The insulating layers may include at least one of silicon oxide, silicon nitride, and silicon oxynitride. The blocking layer may have an etch selectivity compared to the insulating layers.

In example embodiments, each of the channel structures may include a channel region, a drain contact on the channel region, and a gate dielectric layer that extends between the channel region and the gate electrodes. The gate dielectric layer may extend between the blocking layer and the channel layer. An upper surface of the drain contact may be at a height above the substrate that is greater than a height of an upper surface of the blocking layer above the substrate.

In example embodiments, the method may further include connecting each of the memory cell strings to a bit line and a common source line.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 2A to 2C are diagrams of a memory device according to example embodiments of inventive concepts, wherein FIG. 2A is a plan view of the memory device, FIG. 2B is a cross-sectional view taken along a line Ib1-Ib1' of FIG. 2A, and FIG. 2C is a cross-sectional view taken along a line Ic1-Ic1' of FIG. 2A;

FIGS. 5A to 5C are diagrams of a memory device according to example embodiments of inventive concepts, wherein FIG. 5A is a cross-sectional view of the memory device, FIG. 5B is a cross-sectional view taken along a line Ib2-Ib2' of FIG. 5A, and FIG. 5C is a cross-sectional view taken along a line Ic2-Ic2' of FIG. 5A;

DETAILED DESCRIPTION OF EXAMPLE EMBODIMENTS

Figure 1:
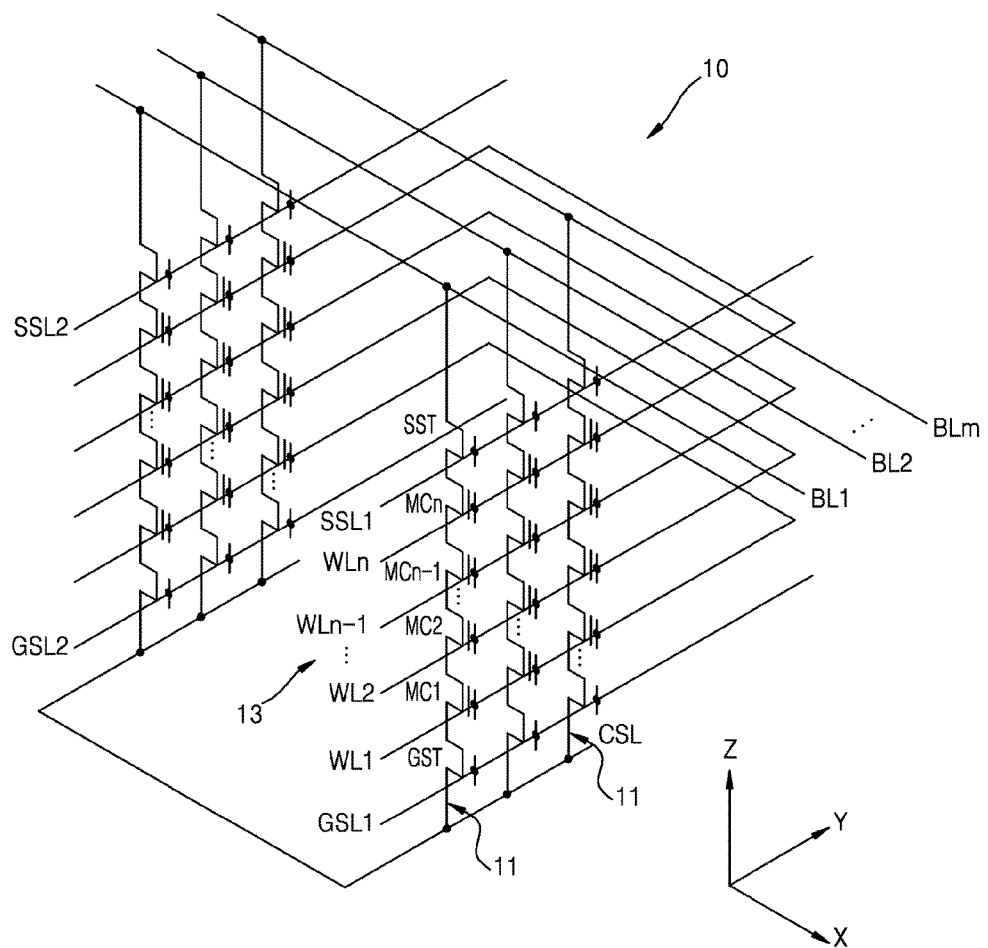
FIG. 1 is an equivalent circuit diagram of a memory cell array of a memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is an equivalent circuit diagram of a memory cell array 10 of a memory device according to example embodiments of inventive concepts. FIG. 1 is an equivalent circuit diagram of an example of a vertical NAND flash memory device having a vertical channel structure.

Referring to FIG. 1, the memory cell array 10 may include a plurality of memory cell strings 11.

The memory cell array 10 may include a plurality of bit lines BL1, BL2, . . . , and BLm, word lines WL1, WL2, . . . , WLn−1, and WLn, string selection lines SSL1 and SSL2, and ground selection lines GSL1 and GSL2 and a common source line CSL.

A plurality of memory cell strings 11 may be formed between the bit lines BL1, BL2, . . . , and BLm and the common source line CSL. Memory cell blocks (not shown) may be formed by a plurality of memory cell strings 11.

Each of the memory cell strings 11 may include a string selection transistor SST, a ground selection transistor GST, and a plurality of memory cell transistors MC1, MC2, . . . , MCn−1, and MCn. The memory cell transistors MC1 to MCn may be stacked on top of each other between at least one string selection transistor SST and at least one ground selection transistor GST.

Drain regions of the string selection transistors SST may be connected to the bit lines BL1, BL2, . . . , and BLm, and source regions of the ground selection transistors GST may be connected to the common source line CSL. The common source line CSL may be a region to which the source regions of the ground selection transistors GST are connected in common.

The string selection transistors SST may be connected to the string selection lines SSL1 and SSL2, and the ground selection transistors GST may be connected to the ground selection lines GSL1 and GSL2. Also, the memory cell transistors MC1, MC2, . . . , MCn−1, and MCn may be respectively connected to the word lines WL1, WL2, . . . , WLn−1, and WLn.

The memory cell array 10 may have a three-dimensionally arranged structure. The memory cell transistors MC1, MC2, . . . , MCn−1, and MCn of the memory cell string 11 may be connected in series along a third direction (Z-axial direction) that is perpendicular to a plane surface (X-Y plane) formed by a first direction (X-axial direction) and a second direction (Y-axial direction), which are parallel to a top surface of a substrate (not shown). Thus, channel regions of the string and ground selection transistors SST and GST and the memory cell transistors MC1, MC2, . . . , MCn−1, and MCn may be formed substantially perpendicularly to the X-Y plane. M memory cells may be provided on each of X-Y planes, and n X-Y planes may be stacked on the substrate in the Z-axial direction. Thus, m bit lines BL1, BL2, . . . , BLm−1, and BLm may be connected to each of the memory cell strings 11, and n word lines WL1, WL2, . . . , WLn−1, and WLn may be connected to each of the memory cells.

Figure 2A:
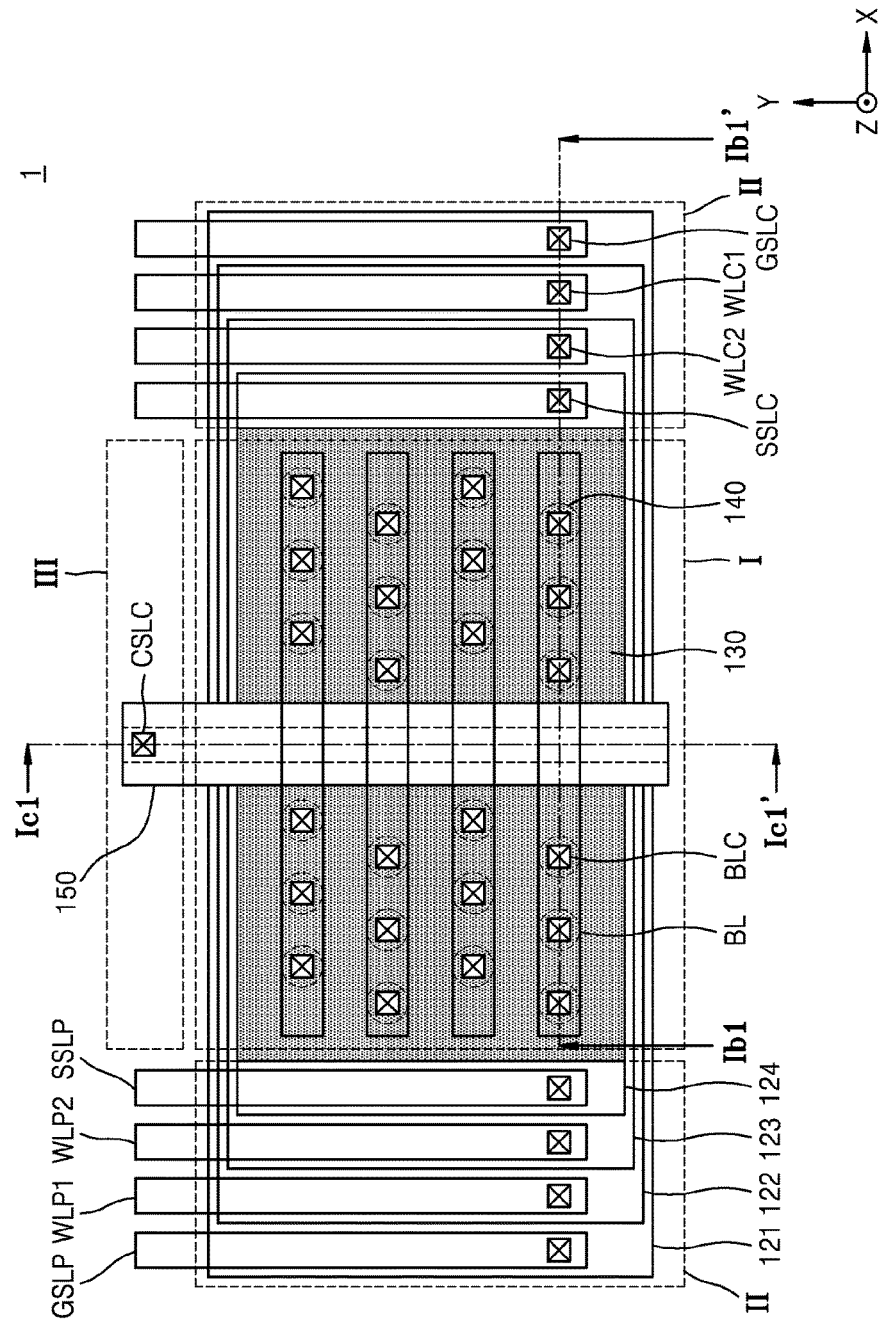
Figure 2B:
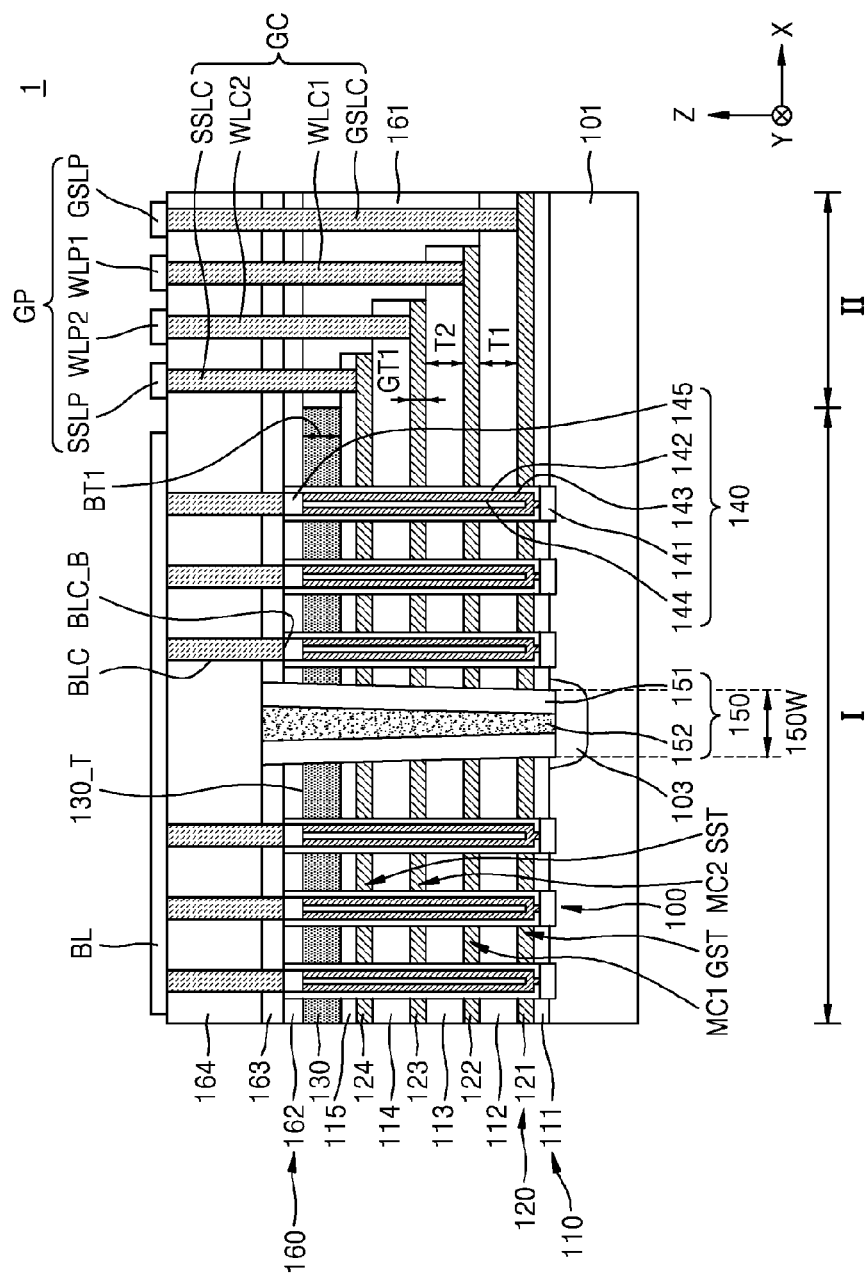
Figure 2C:
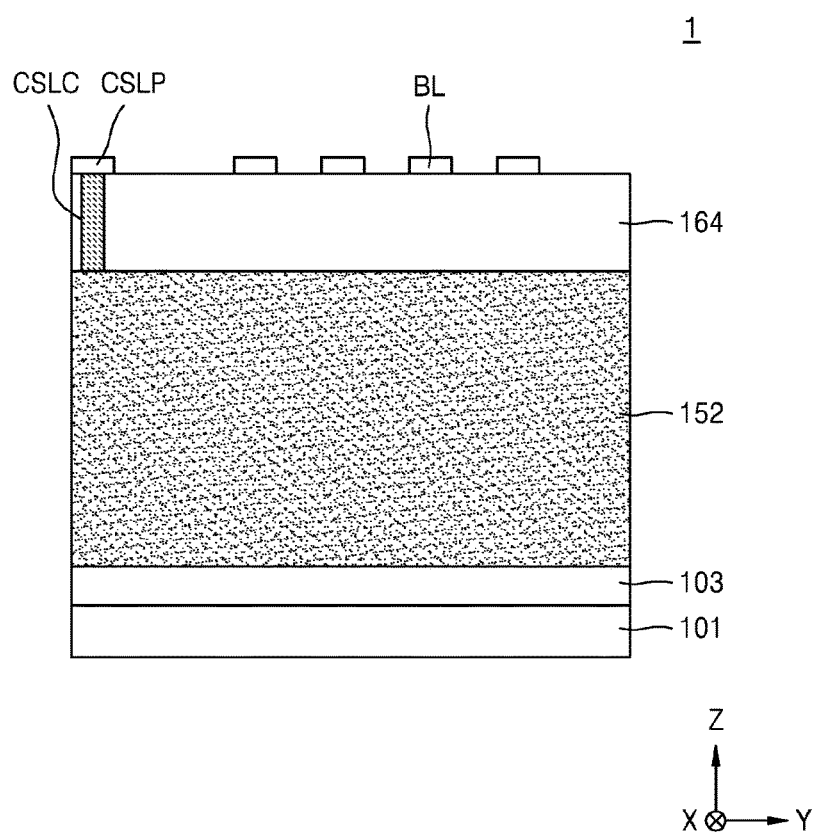

FIGS. 2A to 2C are diagrams of a memory device 1 according to example embodiments of inventive concepts. FIG. 2A is a plan view of the memory device 1, FIG. 2B is a cross-sectional view taken along a line Ib1-Ib1' of FIG. 2A, and FIG. 2C is a cross-sectional view taken along a line Ic1-Ic1' of FIG. 2A.

Referring to FIGS. 2A to 2C, a substrate 101 may have a main surface that extends in a first direction (X-axial direction) and a second direction (Y-axial direction). The substrate 101 may include a semiconductor or a semiconductor-on-insulator. For example, the substrate 100 may include a silicon (Si) substrate, a germanium (Ge) substrate, a silicon-germanium (SiGe) substrate, a silicon-on-insulator (SOI) substrate, or a germanium-on-insulator (GeOI) substrate. Although not shown, a p-well (not shown) may be further formed in the substrate 101.

A cell area I, a connection area II, and a peripheral circuit area III may be defined in the substrate 101.

In example embodiments, the cell area I may be disposed on the substrate 101, and the peripheral circuit area III may be disposed on at least one side of the cell area I. The connection area II may be disposed adjacent to the cell area I.

FIG. 2A illustrates a non-limiting example in which the cell area I, the connection area II, and the peripheral circuit area III are disposed, but example embodiments of inventive concepts are not limited thereto. The cell area I, connection area II, and the peripheral circuit area III may be defined in various arrangements in the substrate 101.

The cell area I may be a region in which a plurality of memory cell strings 11 are disposed. The connection area II may be a region in which gate interconnection pads (SSLP, WLP1, WLP2, and GSLP: GP) and gate contacts (SSLC, WLC1, WLC2, and GSLC: GC) configured to connect gate electrodes 120 of the cell area I are connected to the outside are disposed.

The peripheral circuit area III may be a disposed in which peripheral circuits (not shown) configured to drive a plurality of memory cell strings 11 are disposed. Although FIG. 2A illustrates only one peripheral circuit area III, the number of peripheral circuit areas III is not limited thereto.

The peripheral circuits (not shown) disposed in the peripheral circuit area III may be circuits capable of processing data input to/output from the cell area I at high speed. For example, the peripheral circuits may include a page buffer, a latch circuit, a cache circuit, a column decoder, a row decoder, a sense amplifier, or a data in/output circuit.

A plurality of cell strings 11 may be disposed on the cell area I of the substrate 101. Each of the memory cell strings 100 may include a channel structure 140, which may extend on the substrate 101 in a vertical direction, and a ground selection transistor GST, a plurality of memory cell transistors MC1 and MC2, and a string selection transistor SST disposed along sidewalls of the channel structure 140. Although not shown, a lower dummy transistor (not shown) may be optionally formed between the ground selection transistor GST and a lowermost memory cell transistor MC1, and an upper dummy transistor (not shown) may be further optionally formed between an uppermost memory cell transistor MC2 and the string selection transistor SST.

Although not shown, an isolation layer (not shown) may be formed between the cell area I and the peripheral circuit area III of the substrate 101 or between the connection area II and the peripheral circuit area III of the substrate 101.

A common source region 103 may be disposed in an upper portion of the substrate 101 and extend in a second direction (Y-axial direction). The common source region 103 may be, for example, an impurity region heavily doped with n-type impurities. The common source region 103 may function as a source region configured to supply current to the memory cell string 100.

The channel structure 140 may be spaced apart from the common source region 103 and disposed on a top surface of the substrate 101 and extend in a third direction (Z-axial direction) perpendicular to a first direction (X-axial direction) and the second direction (Y-axial direction).

In example embodiments, the channel structure 140 may have an annular shape. In example embodiments, the channel structure 140 may have a cylindrical shape or a square pillar shape.

In example embodiments, as shown in FIG. 2A, a plurality of channel structures 140 may be disposed zigzag in the second direction (Y-axial direction). That is, two channel structures 140, which are adjacently arranged in the second direction (Y-axial direction), may be offset in the first direction (X-axial direction).

In example embodiments, a plurality of channel structures 140 may be disposed in a matrix shape apart from and parallel to one another in the first direction (X-axial direction) and the second direction (Y-axial direction).

Each of the channel structures 140 may include a first channel contact 141, a gate dielectric layer 142, a channel region 143, a buried insulating layer 144, and a second channel contact 145.

A bottom surface of each of the channel structures 140 may be electrically connected to the substrate 101. For example, as shown, the channel structure 140 may be connected to the substrate 101 through the first channel contact 141 that may protrude from the bottom surface of each of the channel structures 140.

A bottom surface of the first channel contact 141 may be in direct contact with the substrate 101 and electrically connected to the substrate 101. The first channel contact 141 may function as a body contact, which may reduce a resistance of the channel structure 140 and increase a cell current of the memory cell string 100. For example, the first channel contact 141 may include a silicon layer, which may be formed from the substrate 101 using a selective epitaxial growth (SEG) process. In example embodiments, the first channel contact 141 may contain p-type impurities, such as aluminum (Al), boron (B), indium (In), or potassium (K).

In example embodiments, a top surface of the first channel contact 141 may be formed at a higher level than the top surface of the substrate 101.

In example embodiments, the top surface of the first channel contact 141 may be formed at a higher level than a top surface of the ground selection transistor GST, that is, a top surface of the first gate electrode 121.

The gate dielectric layer 142 may be formed on the first channel contact 141 to surround sidewalls of the channel region 143 and sidewalls of the second channel contact 145. The gate dielectric layer 142 may extend along the sidewalls of the channel region 143 and the sidewalls of the second channel contact 145 in a third direction (Z-axial direction) perpendicular to the substrate 101. A bottom surface of the gate dielectric layer 142 may be formed to contact the first channel contact 141. Although not shown, the gate dielectric layer 142 may have, for example, a structure formed by sequentially stacking a tunnel insulating layer, a charge storage layer, and a blocking insulating layer.

The tunnel insulating layer may tunnel electrons into the charge storage layer using a Fowler-Nordheim (FN) tunneling method. The tunnel insulating layer may include, for example, silicon oxide.

The charge storage layer may be a charge trap layer configured to store electrons tunnelled through a tunnel layer. The charge storage layer may include, for example, aluminum oxide, quantum dots, or nano-crystals.

The blocking insulating layer may include silicon oxide or a high-k material having a high dielectric constant. Here, the high-k material may refer to a material having a higher dielectric constant than silicon oxide.

Meanwhile, a diffusion barrier layer (not shown) may be further formed between the gate electrodes 120 and the gate dielectric layer 142. The diffusion barrier layer may include, for example, at least one selected from among aluminum oxide (AlO), tungsten nitride (WN), tantalum nitride (TaN), and titanium nitride (TiN).

The channel region 143 may function as channel regions of the memory cell transistors MC1, MC2, to MCn.

In example embodiments, the channel region 143 may be formed in a region between the gate dielectric layer 142 and the buried insulating layer 144 to surround outer sidewalls of the buried insulating layer 144. The channel region 143 may include, for example, a semiconductor material, such as polysilicon (poly-Si) or single crystalline silicon.

In example embodiments, the channel region 143 may include poly-Si doped with an n-type dopant, such as phosphorus (P), arsenic (As), or antimony (Sb), or a p-type dopant, such as aluminum (Al), boron (B), indium (In), or potassium (K). In example embodiments, the channel region 143 may include undoped poly-Si.

The buried insulating layer 144 may have a cylindrical pillar structure in the channel structure 140. In example embodiments of inventive concepts, the buried insulating layer 144 may include at least one insulating material selected from among silicon oxide, aluminum oxide, or aluminum oxide.

In example embodiments, the second channel contact 145 may be formed on the channel region 143 and the buried insulating layer 144 and surrounded with sidewalls of the gate dielectric layer 142. Although a non-limiting example is shown where the second channel contact 145 is a component of the channel structure 140, example embodiments of inventive concepts are not limited thereto. The second channel contact 145 may be a separate component from the channel structure 140, and formed to contact a top surface of the channel structure 140.

In example embodiments, the second channel contact 145 may function as a drain region. The second channel contact 145 may include poly-Si doped with an n-type dopant, such as phosphorus (P), arsenic (As), or antimony (Sb).

The first to fourth gate electrodes (121, 122, 123, and 124:120) may be arranged along sidewalls the channel structure 140 and spaced apart from one another in the third direction (Z-axial direction). Here, the first to fourth gate electrodes 121, 122, 123, and 124 will be collectively referred to as the gate electrodes 120 for brevity. The gate electrodes 120 may be connected in common to the memory cell strings 11 that are adjacently arranged in the second direction (Y-axial direction). In example embodiments, the gate electrodes 120 may include tungsten, cobalt, nickel, tantalum, tungsten nitride, tungsten silicide, cobalt silicide, nickel silicide, or tantalum silicide.

The first gate electrode 121 may correspond to the ground selection lines GSL1 and GSL2 described with reference to FIG. 1. The second and third gate electrodes 122 and 123 may correspond to word lines WL1, WL2, WLn−1, and WLn described with reference to FIG. 1, and the fourth gate electrode 124 may correspond to the string selection lines SSL1 and SSL2.

Although FIG. 2A illustrates a case in which two word lines are formed for brevity, the number of the word lines is not limited thereto. The word lines may be provided in an appropriate number according to the design of the memory cell strings 11. Also, FIG. 2A illustrates a case in which the string selection lines SSL1 and SSL2 also correspond to one gate electrode 124 for brevity, but at least two fourth gate electrodes 124 may be formed to constitute first and second string selection lines (not shown).

Insulating layers (111, 112, 113, . . . , and 115:110) may be interposed between the first gate electrode 121 and the substrate 101, between adjacent gate electrodes 120, and between the fourth gate electrode 124 and the blocking layer 130. For example, a first insulating layer 111 may be formed between the substrate 101 and the first gate electrode 121, and a second insulating layer 112 may be formed between the first and second gate electrodes 121 and 122. A thickness of each of the insulating layers 110 may vary according to a distance between adjacent gate electrodes 120. For instance, by forming the second insulating layer 112 interposed between the first gate electrode 121 and the second gate electrode 122 to a great thickness, a sufficient distance may be ensured between the ground selection transistor GST and the first memory cell transistor MC1. For example, a first thickness T1 of the second insulating layer 112 obtained in the third direction (Z-axial direction) may be greater than a second thickness T2 of the third insulating layer 113 obtained in the third direction (Z-axial direction).

Each of the insulating layers 110 may include an insulating material (e.g., silicon oxide, silicon nitride, or silicon oxynitride).

The blocking layer 130 may be formed on a top surface of a fifth insulating layer 115 that is an uppermost layer of the insulating layers 110.

The blocking layer 130 may include, for example, aluminum oxide (AlO), hafnium oxide (HfO), silicon nitride (SiN), boron nitride (BN), or silicon carbide (SiC).

In example embodiments, the blocking layer 130 may be formed of a material having a high etch selectivity with respect to upper insulating layers (161, 162, 163, and 164:160). In example embodiments, the blocking layer 130 may be formed of a material having high etch selectivity with respect to the insulating layers 110, the upper insulating layers 160, and the gate electrodes 120.

A thickness of the blocking layer 130 may be different than a thickness of at least one of the gate electrodes 120. A thickness of the blocking layer 130 may be different than a thickness of each of the gate electrodes 120. A thickness BT1 of the blocking layer 130 obtained in the third direction (Z-axial direction) may be greater than a thickness GT1 of each of the gate electrodes 120 obtained in the third direction (Z-axial direction). In example embodiments, the thickness BT1 of the blocking layer 130 obtained in the third direction (Z-axial direction) may be equal to or greater than twice the thickness GT1 of each of the gate electrodes 120 obtained in the third direction (Z-axial direction. The reason that the thickness BT1 of the blocking layer 130 obtained in the third direction (Z-axial direction) may be formed to be greater than the thickness GT1 of each of the gate electrodes 120 obtained in the third direction (Z-axial direction) will be described later with reference to FIGS. 6A to 6M.

In example embodiments, a top surface 130_T of the blocking layer 130 may be at a lower level than a bottom surface BLC_B of each of bit line contacts BLC. That is, the blocking layer 130 may be formed apart from the bit line contacts BLC.

In example embodiments, an X-Y plane of the blocking layer 130 may have a smaller area than an X-Y plane of each of the gate electrodes 120.

In example embodiments, the blocking layer 130 may be formed apart from the gate contacts GC disposed in the connection area II. That is, the blocking layer 130 may be formed only in the cell area I. In example embodiments, unlike shown in FIG. 2B, the blocking layer 130 may be in contact with the string selection line contact SSLC, and formed apart from the word line contacts WLC1 and WLC2 and the ground selection line contact GSLC.

The blocking layer 130 may be interposed between an uppermost gate electrode 124 (i.e., the string selection line SSL) of the gate electrodes 120 and the bit line contact BLC and function to limit and/or prevent an electrical short between the string selection line SSL and the bit line contact BLC, which will be described in detail with reference to FIGS. 7A to 7B.

The upper insulating layers 160 may be formed on the substrate 101 to cover the gate electrodes 120 and the blocking layer 130.

Specifically, the first upper insulating layer 161 may be formed to cover the gate structures 120 disposed in the connection area II. A second upper insulating layer 162 may be formed to cover the first upper insulating layer 161 and the blocking layer 130. The channel structure 140 and a common source line structure 150, which will be described later, may penetrate the second upper insulating layer 162.

A third upper insulating layer 163 may be formed to the channel structure 140, sidewalls of the common source line structure 150, and the second upper insulating layer 162. A fourth upper insulating layer 164 may be formed to cover the third upper insulating layer 163 and a top surface of the common source line structure 150.

Each of the upper insulating layers 160 may include, for example, silicon oxide, silicon nitride, or silicon oxynitride. In example embodiments, the upper insulating layers 160 may include the same material as the insulating layers 110.

The common source line structure 150 may be formed in the cell area I of the substrate 101. In example embodiments, the common source line structure 150 may include common source line spacers 151 and a common source line 152.

The common source line 152 may be formed on the common source region 103 of the substrate 101. For example, the common source line 152 may be formed to extend along the second direction (Y-axial direction) on a partial region of the common source region 103. In some cases, the common source line 152 may be formed on the entire common source region 103 along the second direction (Y-axial direction).

In example embodiments, the common source line 152 may include, for example, a metal, such as tungsten (W), aluminum (Al), copper (Cu), titanium (Ti), or tantalum (Ta). In example embodiments, the common source line 152 may include a conductive material, for example, doped poly-Si or a metal silicide, such as nickel silicide, titanium silicide, tungsten silicide, or cobalt silicide.

The common source line spacers 151 including an insulating material may be formed on two sidewalls of the common source line 152. The common source line spacers 151 may be formed on the two sidewalls of the gate electrodes 120 and serve as an isolation layer configured to electrically insulate the gate electrodes 120 from the common source line 152.

Although not shown, a common source line buried insulating layer (not shown) may be formed in at least a partial region of a top surface of the common source line 152. The common source buried insulating layer may be interposed between the common source line 152, which extends in the second direction (Y-axial direction), and the bit line BL, which extends in the first direction (X-axial direction) on the common source line 152, and serve as an isolation layer configured to electrically insulate the common source line 152 from the bit line BL.

The bit line BL may be disposed on the fourth upper insulating layer 164 disposed in the cell area I, and extend in the first direction (X-axial direction). The bit line BL may be electrically connected to the memory cell strings 11 through the bit line contact BLC.

The gate interconnection pads GP may be disposed on the fourth upper insulating layer 164 disposed in the connection area II. The gate interconnection pads GP may include a string selection line pad SSLP, first and second word line pads WLP1 and WLP2, and a ground selection line pad GSLP.

The gate interconnection pads GP may be electrically connected to the gate electrodes 120 through the gate contacts GC.

Specifically, the string selection line pad SSLP may be a conductive pad configured to transmit signals from a peripheral gate structure (not shown) of the peripheral circuit area III to the gate electrode 124 corresponding to the string selection lines (refer to SSL1 and SSL2 in FIG. 1). The string selection line pad SSLP may be electrically connected to the gate electrode 124 through the string selection line contact SSLC.

The first and second word line pads WLP1 and WLP2 may be respectively conductive pads configured to transmit signals from the peripheral gate structure of the peripheral circuit area III to the second and third gate electrodes 122 and 123 corresponding to the word lines (refer to WL1, WL2, . . . , WLn−1, and WLn in FIG. 1). The first and second word line pads WLP1 and WLP2 may be electrically connected to the second and third gate electrodes 122 and 123 through the first and second word line contacts WLC1 and WLC2.

The ground selection line pad GSLP may be a conductive pad configured to transmit signals from the peripheral gate structure of the peripheral circuit area III to the gate electrode 121 corresponding to the ground selection lines (refer to GSL1 and GSL2 in FIG. 1). The ground selection line pad GSLP may be electrically connected to the gate electrode 121 through the ground selection line contact GSLC.

The common source line pad CSLP may be formed on the fourth upper insulating layer 164 disposed in the peripheral circuit area III. The common source line pad CSLP may be a conductive pad configured to transmit signals from the peripheral gate structure of the peripheral circuit area III to the common source line 152. The common source line pad CSLP may be electrically connected to the common source line 152 through the common source line contact CSLC.

Figure 3:
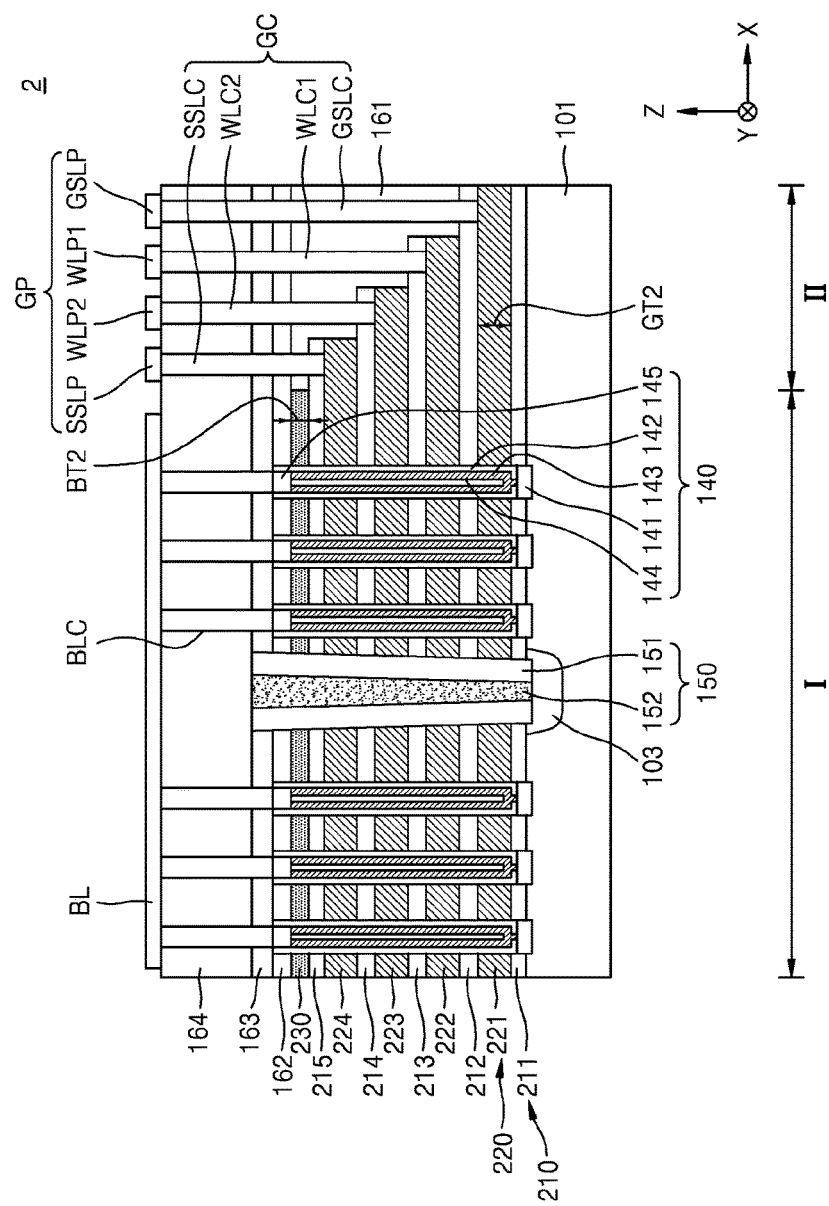
FIG. 3 is a diagram of a memory device according to example embodiments of inventive concepts, which is a cross-sectional view corresponding to a line Ib1-Ib1' of FIG. 2A.

FIG. 3 is a diagram of a memory device 2 according to example embodiments of inventive concepts, which is a cross-sectional view corresponding to a line Ib1-Ib1' of FIG. 2A. In FIG. 3, the same reference numerals are used to denote the same elements as in FIGS. 2A to 2C, and repeated descriptions thereof are omitted for brevity.

In example embodiments, the memory device 2 may have a similar structure to the memory device 1 described with reference to FIGS. 2A to 2C except for structures of gate electrodes (221, 222, 223, and 224:220) and a structure of a blocking layer 230.

Referring to FIG. 3, a thickness BT2 of the blocking layer 230 obtained in a third direction (Z-axial direction) may be smaller than a thickness GT2 of each of the gate electrodes 220 obtained in the third direction (Z-axial direction). Alternatively, the thickness BT2 of the blocking layer 230 obtained in the third direction (Z-axial direction) may be substantially equal to the thickness GT2 of each of the gate electrodes 220 obtained in the third direction (Z-axial direction).

Insulating layers (211, 212, 213, 214, and 215:210) may have similar structures to the insulating layers 110 described with reference to FIGS. 2A to 2C. However, a thickness of each of the insulating layers 210 obtained in the third direction (Z-axial direction) may be different from a thickness of each of the insulating layers (refer to 110 in FIG. 2B) obtained in the third direction (Z-axial direction).

The reason that the thickness BT2 of the blocking layer 130 obtained in the third direction (Z-axial direction) may be formed to be smaller than the thickness GT2 of each of the gate electrodes 220 obtained in the third direction (Z-axial direction) will be described later with reference to FIGS. 8A to 8M.

Figure 4:
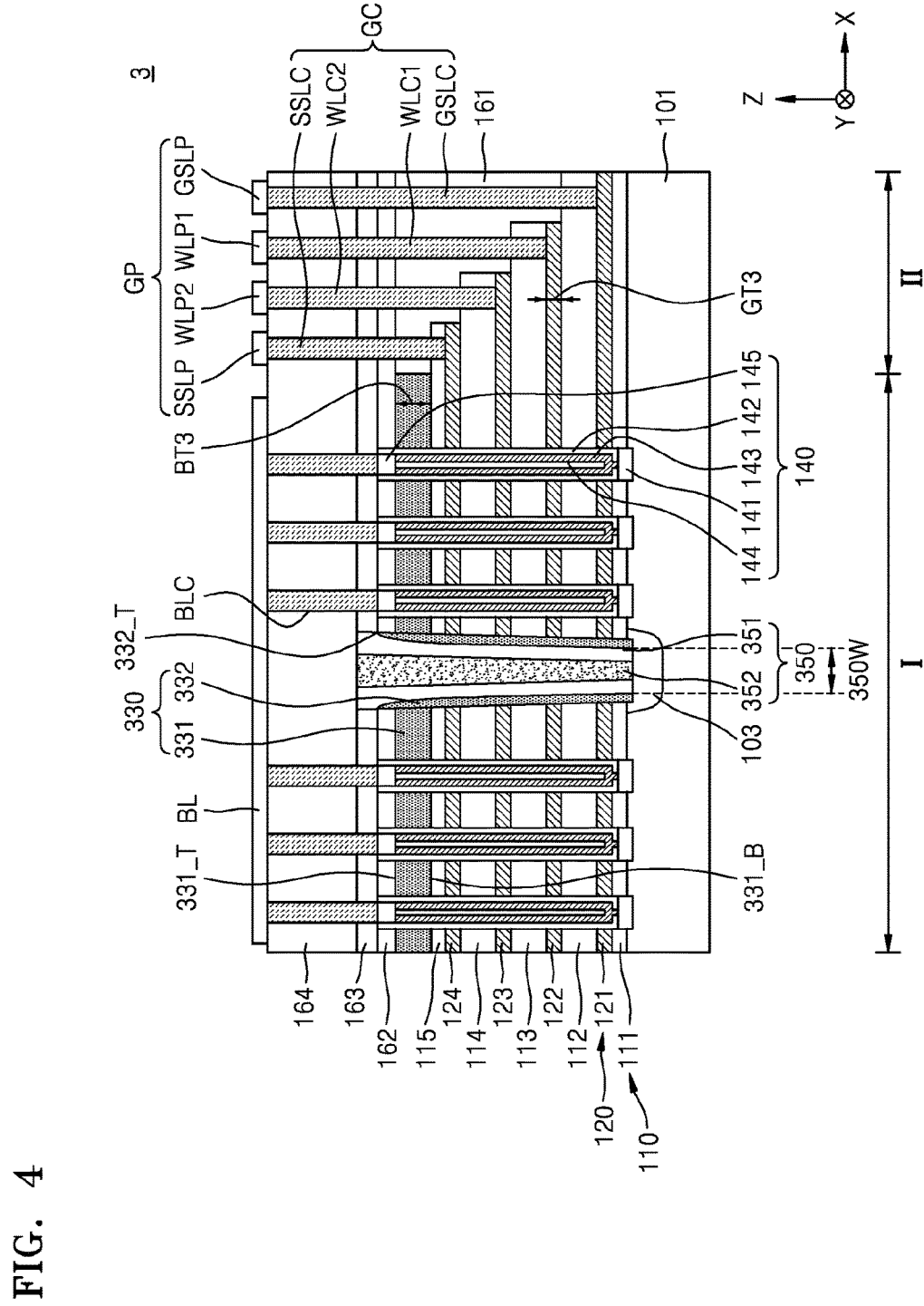
FIG. 4 is a diagram of a memory device according to example embodiments of inventive concepts, which is a cross-sectional view taken along a line Ib1-Ib1' of FIG. 2A.

FIG. 4 is a diagram of a memory device 4 according to example embodiments of inventive concepts, which is a cross-sectional view taken along a line Ib1-Ib1' of FIG. 2A. In FIG. 4, the same reference numerals are used to denote the same elements as in FIGS. 2A to 2C, and repeated descriptions thereof are omitted for brevity.

In example embodiments, the memory device 3 may have a similar structure to the memory devices 1 and 2 described with reference to FIGS. 2A to 3 except for structures of a blocking layer 330 and a common source line structure 350.

Referring to FIG. 4, the blocking layer 330 may include a first blocking layer 331 and a second blocking layer 332.

The first blocking layer 331 may have a similar structure to the blocking layer 130 described with reference to FIG. 2A to 2C or the blocking layer 230 described with reference to FIG. 3.

That is, similar to the blocking layer (refer to 130 in FIG. 2B), a thickness BT3 of the first blocking layer 331 obtained in the third direction (Z-axial direction) may be greater than a thickness GT3 of each of the gate electrodes 120 obtained in the third direction (Z-axial direction.

Alternatively, similar to the blocking layer (refer to 230 in FIG. 3) the thickness BT3 of the first blocking layer 331 obtained in the third direction (Z-axial direction) may be formed to be smaller than the thickness GT3 of each of the gate electrodes 120 obtained in the third direction (Z-axial direction).

The second blocking layer 332 may be formed along an inner sidewall of an opening G. The second blocking layer 332 may be derived from the blocking layer (refer to 130x in FIG. 6J) remaining within the opening G after the blocking layer 130x is etched.

The second blocking layer 332 may be formed along two sidewalls of the common source line structure 350. Thus, a width 350W of the common source line structure 350 obtained in a first direction (X-axial direction) may be formed to be smaller than a width 150W of the common source line structure 150 (described with reference to FIG. 2B) obtained in the first direction (X-axial direction).

In example embodiments, as shown in FIG. 4, a top surface 332_T of the second blocking layer 332 may be formed at a higher level than a top surface 331_T of the first blocking layer 331.

In example embodiments, unlike shown in FIG. 4, the top surface 332_T of the second blocking layer 332 may be formed at a lower level than a bottom surface 331_B of the first blocking layer 331.

Figure 5A:
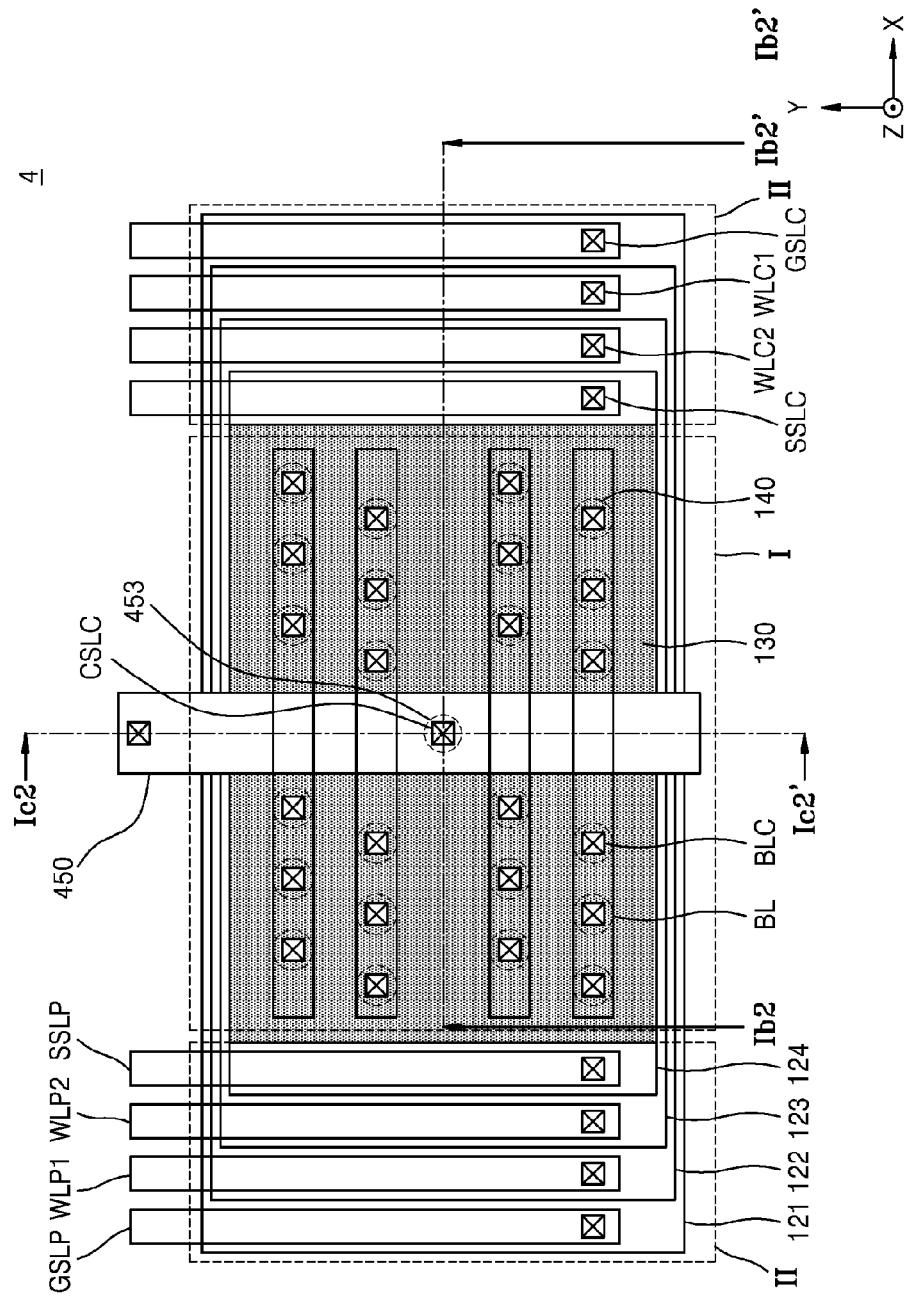
Figure 5B:
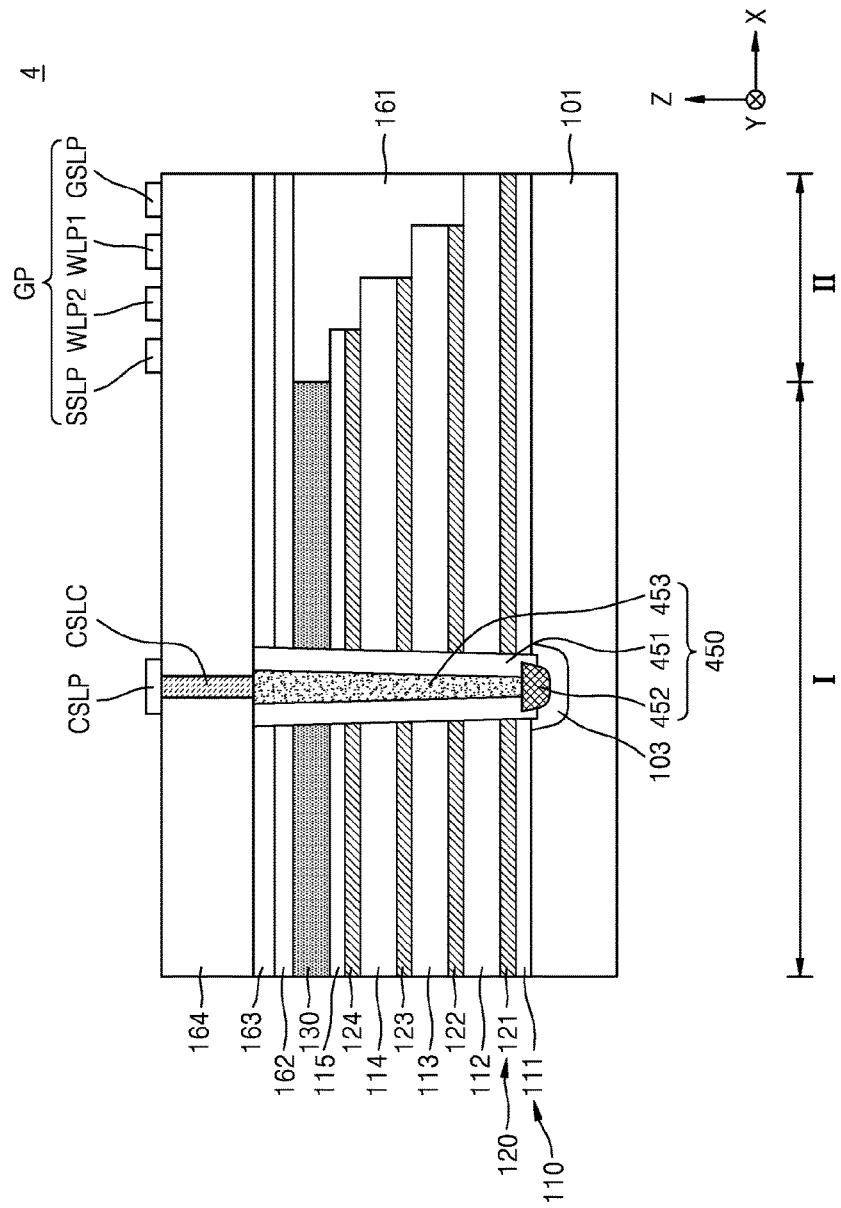
Figure 5C:
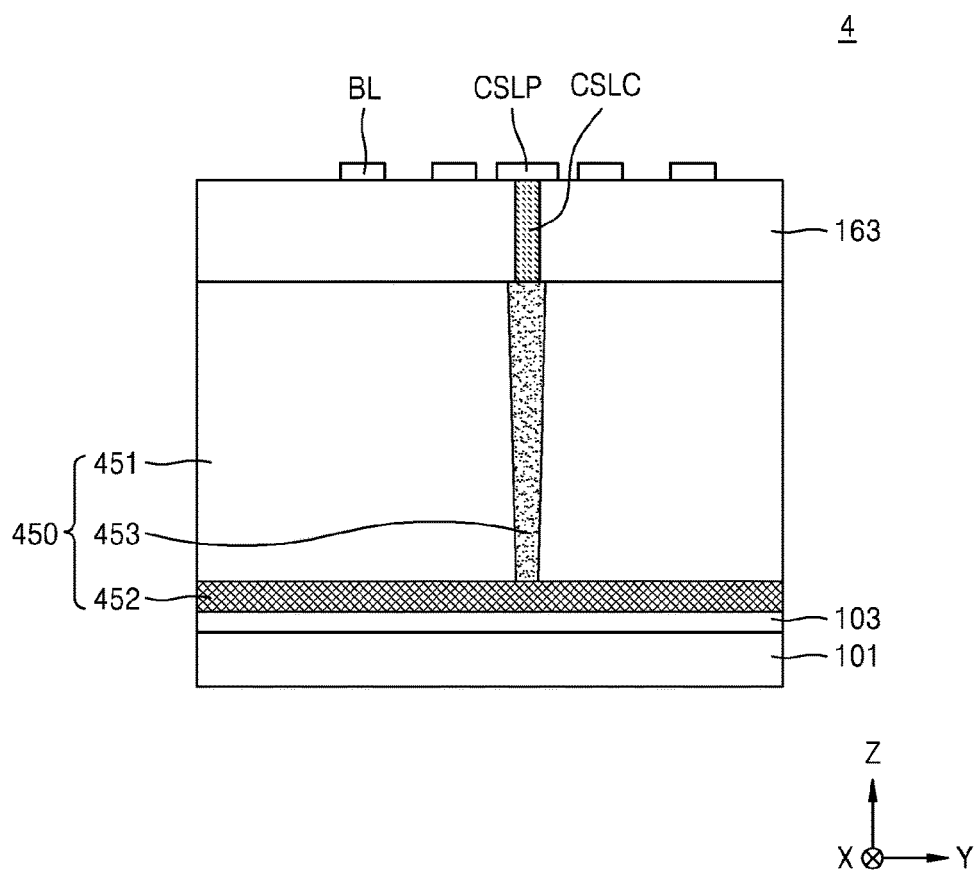

FIGS. 5A to 5C are diagrams of a memory device 4 according to example embodiments of inventive concepts. FIG. 5A is a plan view of the memory device 4, FIG. 5B is a cross-sectional view taken along a line Ib2-Ib2' of FIG. 5A, and FIG. 5C is a cross-sectional view taken along a line Ic2-Ic2' of FIG. 5A.

In FIGS. 5A to 5C, the same reference numerals are used to denote the same elements as in FIGS. 2A to 2C, and repeated descriptions thereof are omitted for brevity.

In example embodiments, the memory device 4 may have a similar structure to the memory device 1 described with reference to FIGS. 2A to 2C except for a structure of a common source line structure 450.

Referring to FIGS. 5A to 5C, the common source line structure 450 may include a common source line insulating layer 451, a common source line 452, and a contact layer 453.

The common source line 452 may be formed on a common source region 103 of a substrate 101. For example, the common source line 452 may be formed on a partial region of the common source region 103 and extend in a second direction (Y-axial direction). In some cases, the common source line 452 may be formed on the entire common source region 103 in the second direction (Y-axial direction).

In example embodiments, the common source line 452 may include, for example, tungsten, aluminum, copper, titanium, or tantalum. In example embodiments, the common source line 452 may include a conductive material, for example, doped poly-Si or a metal silicide, such as nickel silicide, titanium silicide, tungsten silicide, or cobalt silicide.

The contact layer 453 may be formed on the common source line 452 and electrically connect the common source line 452 with a common source line contact CSLC. The contact layer 453 may have, for example, a cylindrical shape or a square pillar shape.

In example embodiments, the contact layer 453 may include a metal, such as tungsten, aluminum, copper, titanium, or tantalum, and the common source line 452 may include a conductive material, for example, a metal silicide such as nickel silicide, titanium silicide, tungsten silicide, or cobalt silicide.

The common source line insulating layer 451 may be formed on the common source region 103 to cover the common source line 452 and the contact layer 453.

The common source line insulating layer 451 may be formed on sidewalls of gate electrodes 120 and serve as an isolation layer configured to electrically insulate the gate electrodes 120 from the common source line 452 and contact layer 453.

FIGS. 6A to 6M are cross-sectional views illustrating processes of a method of fabricating a memory device, according to example embodiments of inventive concepts. In FIGS. 6A to 6M, the same reference numerals are used to denote the same elements as in FIGS. 2A to 2C, and repeated descriptions thereof are omitted for brevity.

In FIG. 4, the same reference numerals are used to denote the same elements as in FIGS. 2A to 2C, and repeated descriptions thereof are omitted for brevity.

Figure 6A:
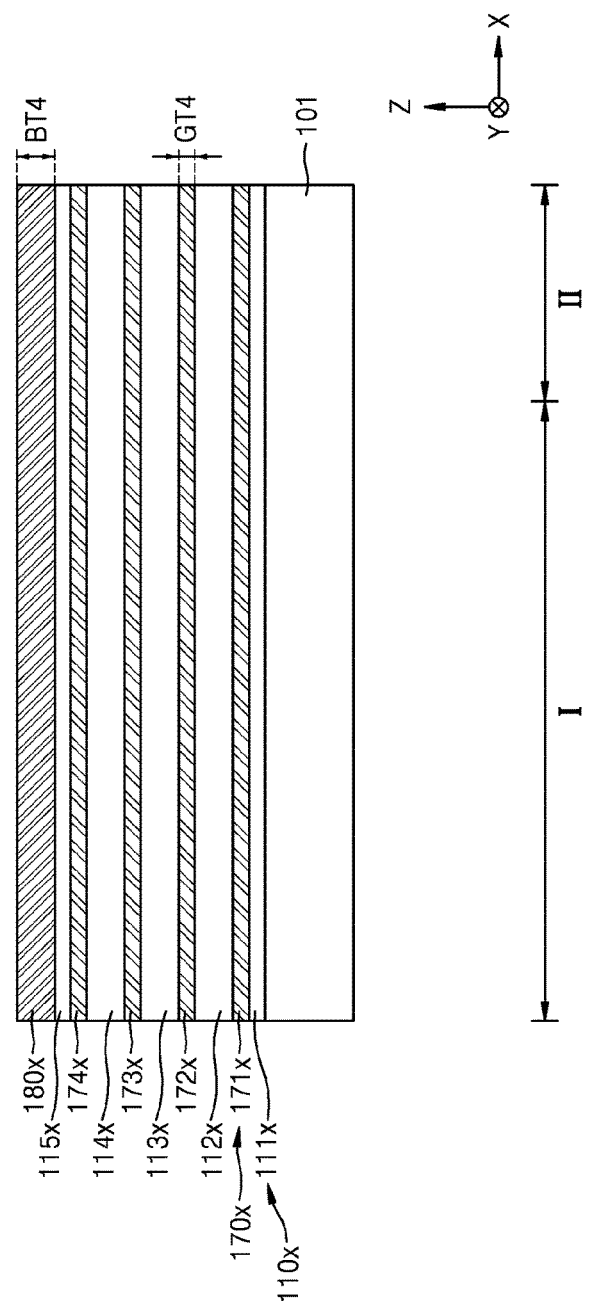
FIGS. 6A to 6M are cross-sectional views illustrating processes of a method of fabricating a memory device, according to example embodiments of inventive concepts.

Referring to FIG. 6A, insulating layers (111x, 112x, 113x, 114x, and 115x:110x) and gate sacrificial layers (171x, 172x, 173x, and 174x:170x) may be alternately stacked on a substrate 101. A blocking sacrificial layer 180x may be formed on a fifth insulating layer 115x, which is an uppermost layer of the insulating layers 110x.

In example embodiments, the insulating layers 110x may be formed of silicon oxide, silicon nitride, or silicon oxynitride by using a chemical vapor deposition (CVD) process or an atomic layer deposition (ALD) process.

The gate sacrificial layers 170x and the blocking sacrificial layer 180x may be formed of a material having a high etch selectivity with respect to the insulating layers 110x. For example, the gate sacrificial layers 170x and the blocking sacrificial layer 180x may be formed of poly-Si, silicon nitride, or silicon carbide by using a CVD process or an ALD process. In example embodiments, the gate sacrificial layers 170x and the blocking sacrificial layer 180x may be formed using the same process.

A thickness BT4 of the blocking sacrificial layer 180x obtained in a third direction (Z-axial direction) may be greater than a thickness GT4 of each of the gate sacrificial layers 170x obtained in the third direction (Z-axial direction). In example embodiments, the thickness BT4 of the blocking sacrificial layer 180x obtained in the third direction (Z-axial direction) may be equal to or greater than twice the thickness GT4 of each of the gate sacrificial layers 170x obtained in the third direction (Z-axial direction).

Figure 6B:
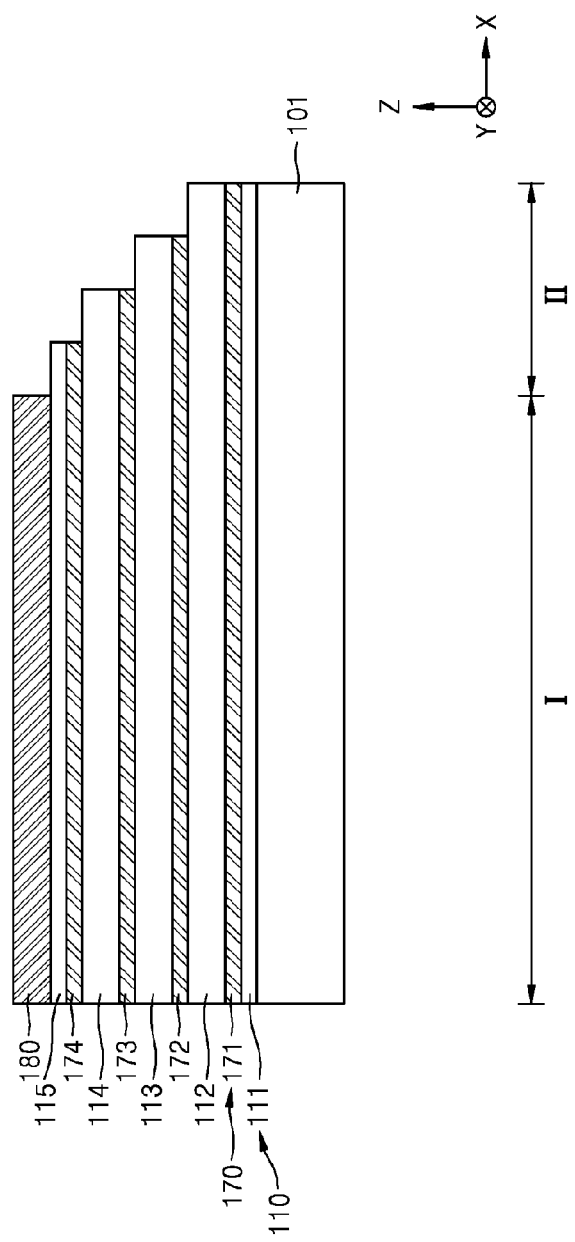

Referring to FIG. 6B, the insulating layers 110x, the gate sacrificial layers 170x, and the blocking sacrificial layer 180x may be sequentially etched by performing an etching process plural times, thereby forming insulating layers 110, gate sacrificial layers 170, and a blocking sacrificial layer 180 having step differences, as shown in FIG. 6B.

A process of forming a third insulating layer 113 and a second gate sacrificial layer 172 shown in FIG. 6B may include, for example, forming a mask layer (not shown) to expose a desired (and/or alternatively predetermined) width of an edge of the blocking sacrificial layer 180x disposed in the connection area II, and etching the insulating layers 113x, 114x, and 115x, the gate sacrificial layers 172x, 173x, and 174x, and the blocking sacrificial layer 180x corresponding to the edge of the blocking sacrificial layer 180x, on which the mask layer is not formed, until a top surface of a second insulating layer 112 is exposed. The etching process may be, for example, an anisotropic etching process using a dry etching process or a wet etching process.

Processes similar to the above-described processes may be repetitively performed, thereby forming insulating layers 110, gate sacrificial layers 170, and a blocking sacrificial layer 180 having step differences, as shown in FIG. 6B.

Figure 6C:
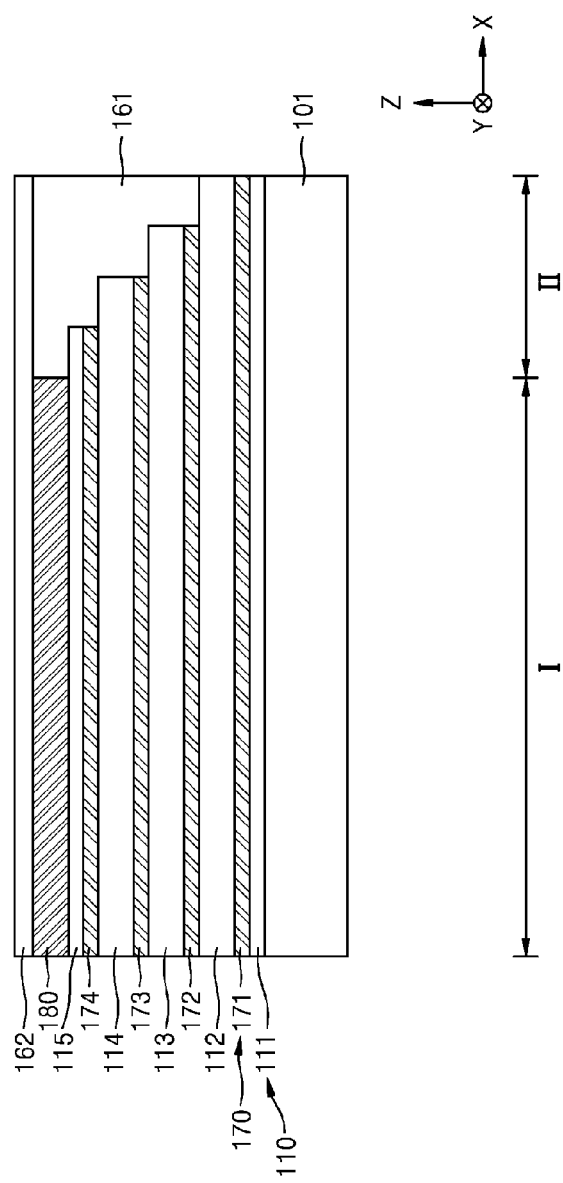

Referring to FIG. 6C, a first upper insulating layer 161 may be formed to cover the exposed insulating layers 110 and gate sacrificial layers 170 in the connection area II of the substrate 101 and cover a side surface of the blocking sacrificial layer 180. After forming the first upper insulating layer 161, a second upper insulating layer 162 may be formed to cover the first upper insulating layer 161 and the blocking sacrificial layer 180.

The first upper insulating layer 161 and the second upper insulating layer 162 may be formed of silicon oxide, silicon nitride, or silicon oxynitride using a CVD process or an ALD process.

Figure 6D:
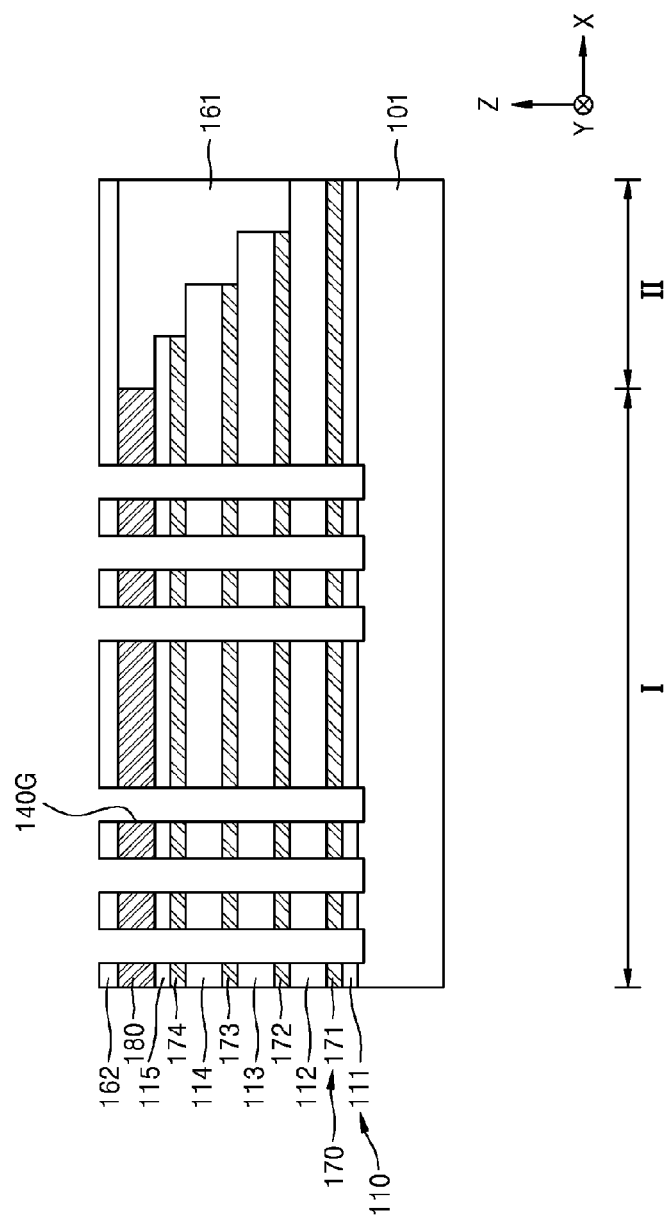

Referring to FIG. 6D, channel holes 140G may be formed to penetrate a stack structure of the insulating layers 110, the gate sacrificial layers 170, the second upper insulating layer 162, and the blocking sacrificial layer 180. The channel holes 140G may penetrate the stack structure and expose portions of a top surface of the substrate 101.

In example embodiments, the portions of the top surface of the substrate 101 that are exposed at bottom surfaces of the channel holes 140G may be excessively etched during the formation of the channel holes 140G so that the substrate 101 may be recessed to a desired (and/or alternatively predetermined) depth.

The channel holes 140G may extend in the third direction (Z-axial direction) of the substrate 101 and be formed a desired (and/or alternatively predetermined) distance apart from one another in a first direction (X-axial direction) and a second direction (Y-axial direction).

In example embodiments, the channel hole 140G may be disposed zigzag in the second direction (Y-axial direction). That is, two channel holes 140G adjacently arranged in the second direction (Y-axial direction) may be offset in the first direction (X-axial direction). In example embodiments, the channel holes 140G may be disposed apart from and parallel to one another and arranged as a matrix type in a first direction (X-axial direction) and the second direction (Y-axial direction).

A horizontal section of each of the channel holes 140G may have a circular shape, but example embodiments of inventive concepts are not limited thereto. A horizontal section of each of the channel holes 140G may have one of various shapes.

Figure 6E:
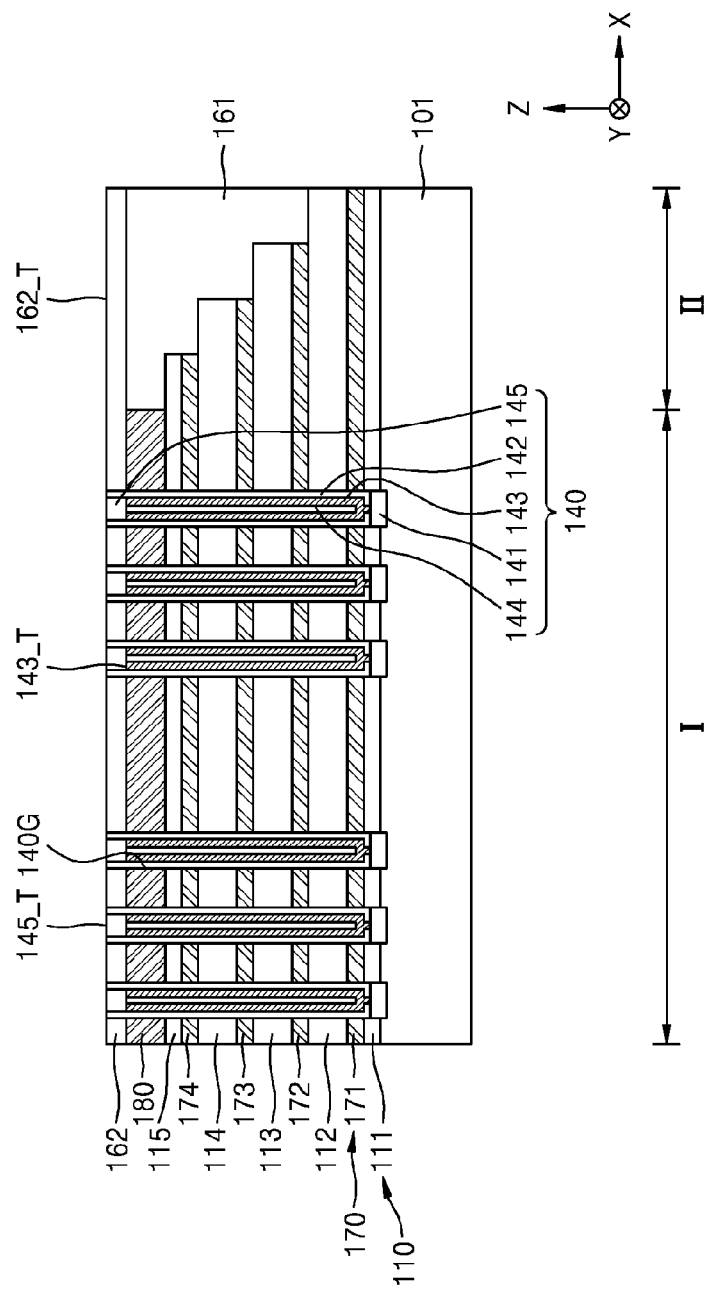

Referring to FIG. 6E, a channel structure 140 may be formed on an inner wall of each of the channel holes 140G. The channel structure 140 may include a first channel contact 141, a gate dielectric layer 142, a channel region 143, a buried insulating layer 144, and a second channel contact 145.

The first channel contact 141 may be grown from the part of the substrate 101 that is exposed by the channel hole 140G using an SEG process.

In example embodiments, the first channel contact 141 may be grown until a top surface of the first channel contact 141 is at a higher level than the top surface of the substrate 101.

In example embodiments, the first channel contact 141 may be grown until the top surface of the first channel contact 141 is at a higher level than a top surface of a first gate sacrificial layer 171.

Thereafter, a p-type dopant, such as aluminum, boron, indium, or potassium, may be implanted into the first channel contact 141 using an ion implantation process. In another case, a p-type dopant may be doped in-situ during the process of growing the first channel contact 141 using the SEG process.

After the first channel contact 141 is formed, a gate dielectric layer (not shown) may be formed to uniformly cover inner walls and bottom surfaces of the channel holes 140G, in which the first channel contacts 141 are formed, and a top surface of the second upper insulating layer 162. As described above with reference to FIGS. 2A to 2C, the gate dielectric layer may include a tunnel insulating layer, a charge storage layer, or a blocking insulating layer.

The blocking insulating layer, the charge storage layer, and the tunnel insulating layer may be sequentially stacked within the channel holes 140G. The blocking insulating layer, the charge storage layer, and the tunnel insulating layer may be formed using an ALD process, a CVD process, or a physical vapor deposition (PVD) process.

Thereafter, only the gate dielectric layer formed on inner walls and bottom edge regions of the channel holes 140G may remain by using an etch back process, thereby forming the gate dielectric layer 142.

After the gate dielectric layer 142 is formed, a channel layer (not shown) may be formed on the first channel contact 141, the gate dielectric layer 142, and the second upper insulating layer 162. The channel layer may be formed of a semiconductor material, such as poly-Si or single crystalline silicon. The semiconductor material may be undoped or doped with an n-type dopant or a p-type dopant. The channel layer may be formed to a uniform thickness using an ALD process or a CVD process.

After the channel layer is formed, the remaining channel hole 140G may be filled with an insulating layer (not shown). In example embodiments, before the insulating layer is formed, a hydrogen annealing process may be performed to anneal a structure including the channel layer in a gas atmosphere containing hydrogen or heavy hydrogen. Due to the hydrogen annealing process, large parts of crystal defects in the channel layer may be cured.

Thereafter, a planarization process, for example, a chemical mechanical polishing (CMP) process and/or an etch back process may be performed on the channel layer and the insulating layer, thereby forming the channel region 143 and the buried insulating layer 144.

Although an example has been described in which an etch back process may be performed so that a top surface 143_T of the channel region 143 and the buried insulating layer 144 may be at a lower level than a top surface 162_T of the second upper insulating layer 162, when only a CMP process is performed, the top surface 143_T of the channel region 143 and the buried insulating layer 144 may be at the same level as the top surface 162_T of the second upper insulating layer 162.

Meanwhile, in example embodiments, when the channel layer completely fills the channel holes 140G, the insulating layer may not be additionally formed, and the buried insulating layer 144 may not be formed within the channel holes 140G.

The formation of the second channel contact 145 may include forming a conductive layer (not shown) to fill spaces of the channel holes 140G, which may remain after the channel region 143 and the buried insulating layer 144 are formed, and planarizing the conductive layer. A top surface 145_T of the second channel contact 145 may be formed at the same level as the top surface 162_T of the second upper insulating layer 162.

Figure 6F:
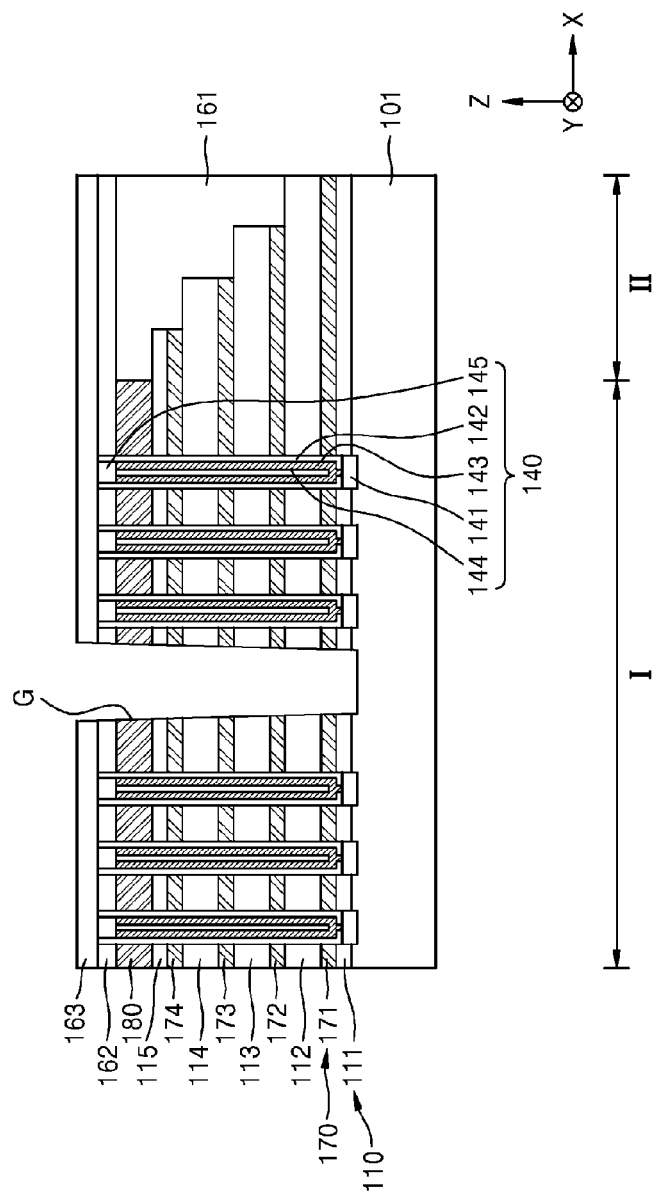

Referring to FIG. 6F, a third upper insulating layer 163 may be formed to cover the top surface 162_T of the second upper insulating layer 162 and a top surface of the channel structure 140. The third upper insulating layer 163 may function to protect the channel structure 140 during a planarization process that may be subsequently performed. The third upper insulating layer 163 may include, for example, silicon oxide, silicon nitride, or silicon oxynitride.

Thereafter, an opening G may be formed in the second direction (Y-axial direction) through a stack structure of the third upper insulating layer 163, the insulating layers 110, and the sacrificial layers, namely, the gate sacrificial layer 170 and the blocking sacrificial layer 180. A top surface of the substrate 101 may be exposed by the opening G.

In example embodiments, a portion of a top surface of the substrate 101 that is exposed at a bottom surface of the opening G may be excessively etched during the formation of the opening G so that the substrate 101 may be recessed to a desired (and/or alternatively predetermined) depth.

Figure 6G:
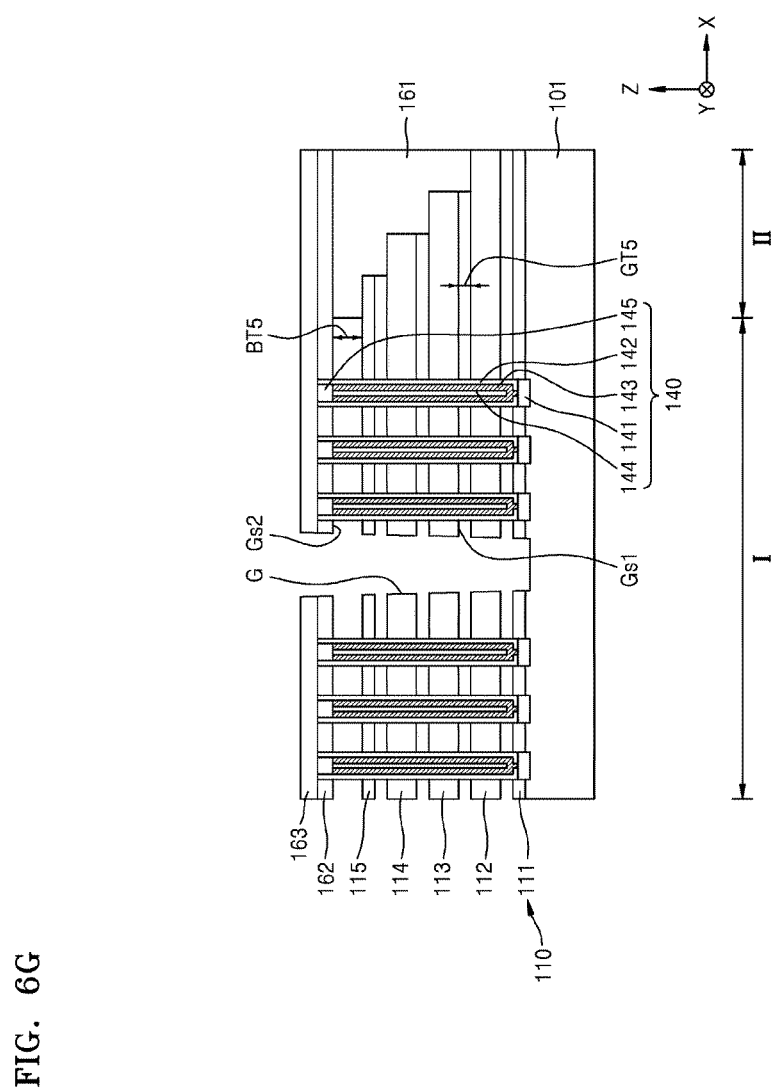

Referring to FIG. 6G, the sacrificial layers, namely, the gate sacrificial layer 170 and the blocking sacrificial layer 180, that are exposed by the opening G may be removed to form side openings, for example, first and second side openings Gs1 and Gs2, between adjacent insulating layers 110.

Here, the first side openings Gs1 may refer to an opening formed by removing the gate sacrificial layers 170, and the second side opening Gs2 may refer to an opening formed by removing the blocking sacrificial layer 180.

As described above with reference to FIG. 6A, a thickness BT4 of the blocking sacrificial layer 180x obtained in the third direction (Z-axial direction) may be formed to be greater than a thickness GT4 of each of the gate sacrificial layers 170x obtained in the third direction (Z-axial direction). Thus, a thickness BT5 of the second side opening Gs2 obtained in the third direction (Z-axial direction) may be formed to be greater than a thickness GT5 of each of the first side openings Gs1 obtained in the third direction (Z-axial direction).

A process of forming the side openings, for example, the first and second side openings Gs1 and Gs2, may be a wet etching process using an etchant having an etch selectivity with respect to the sacrificial layers, namely, the gate sacrificial layer 170 and the blocking sacrificial layer 180. For example, when the sacrificial layers, namely, the gate sacrificial layer 170 and the blocking sacrificial layer 180, include aluminum oxide, the sacrificial layers, namely, the gate sacrificial layer 170 and the blocking sacrificial layer 180, may be removed by means of a wet etching process using an etchant containing phosphoric acid.

The etching process may be an isotropic etching process using a wet etching process or a chemical dry etching (CDE) process.

Figure 6H:
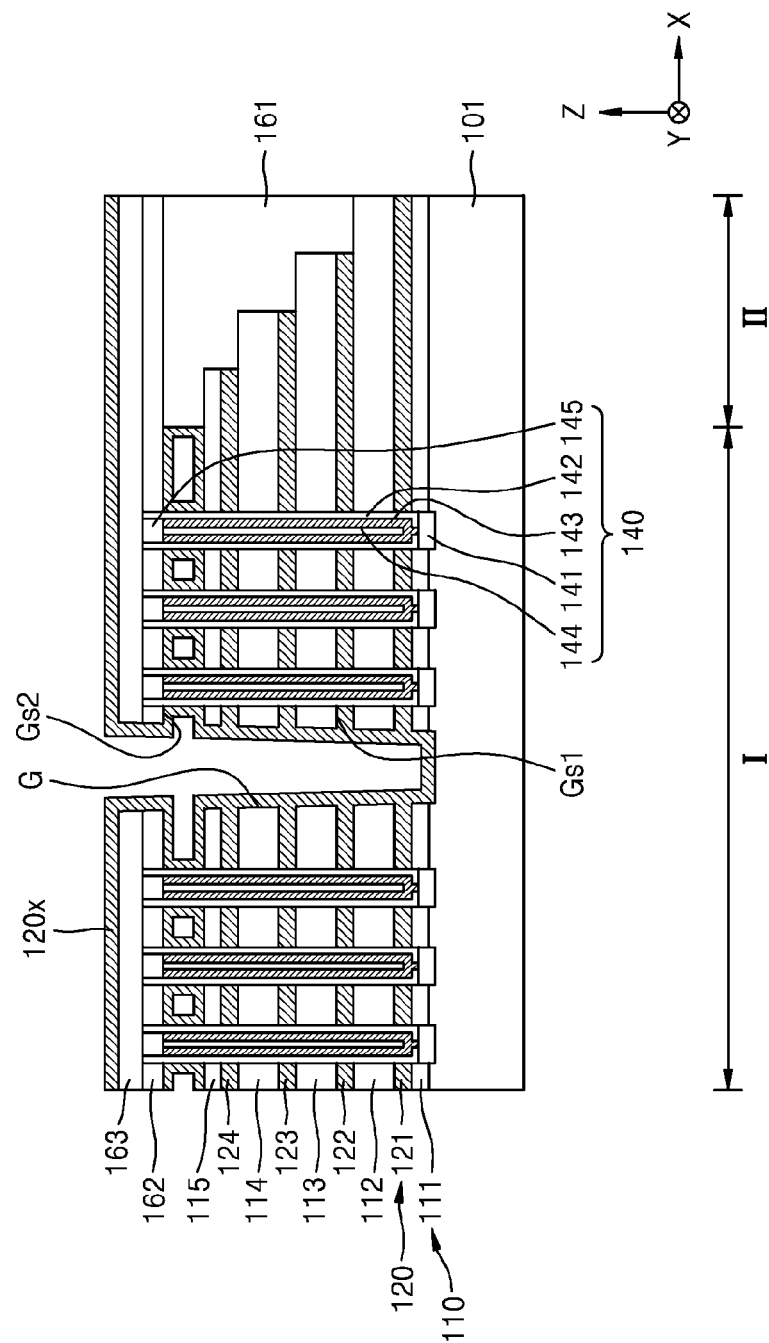

Referring to FIG. 6H, a conductive material 120x may be formed on the third upper insulating layer 163 and the opening G and the first and second side openings Gs1 and Gs2. The conductive material 120x may be a metal, for example, tungsten. The first side openings Gs1 may be completely filled with the conductive material 120x. Meanwhile, as shown in FIG. 6H, only a bottom surface and portions of side surfaces of the second side opening Gs2 may be filled with the conductive material 120x so that the second side opening Gs2 may have an air gap.

As described above with reference to FIG. 6G, the first side openings Gs1 may be completely filled and the second side opening Gs2 may be partially filled because the thickness GT5 of each of the first side openings Gs1 obtained in the third direction (Z-axial direction) is different from the thickness BT5 of the second side opening Gs2 obtained in the third direction (Z-axial direction).

Figure 6I:
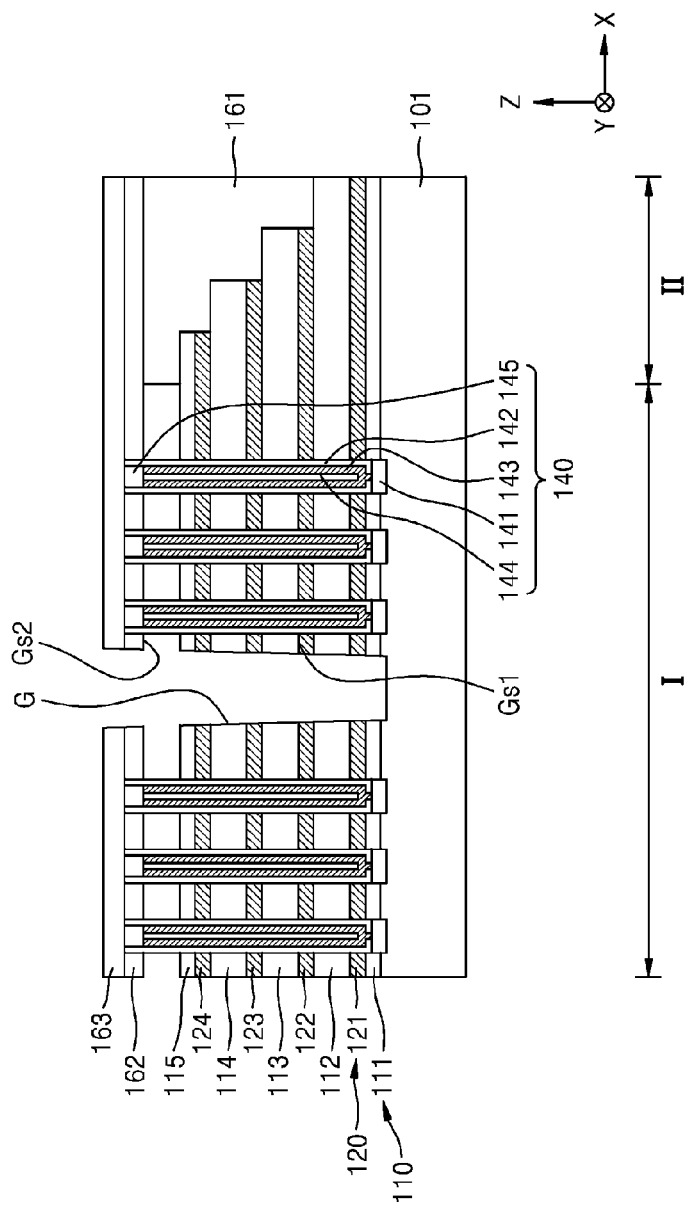

Referring to FIG. 6I, the conductive material 120x, except for the conductive material 120x formed in a region of the first side openings Gs1, may be removed. That is, the conductive material 120x, which is formed on a top surface of the third upper insulating layer 163 and regions of the opening G and the second side opening Gs2, may be removed to form gate electrodes 120.

A process of forming the gate electrodes 120 may be, for example, an etching process. For example, the process of forming the gate electrodes 120 may be a wet etching process using an etchant having a relatively high etch selectivity with respect to the conductive material 120x and having a relatively low etch selectivity with respect to the insulating layers, namely, the insulating layers 110 and the upper insulating layers 160.

As shown in FIG. 6H, only the conductive material 120x formed in the region of the second side opening Gs2 may be exposed to the etchant, and the conductive material 120x formed in the region of the first side openings Gs1 may not be exposed to the etchant. Thus, the gate electrodes 120 may be formed using the etching process.

Figure 6J:
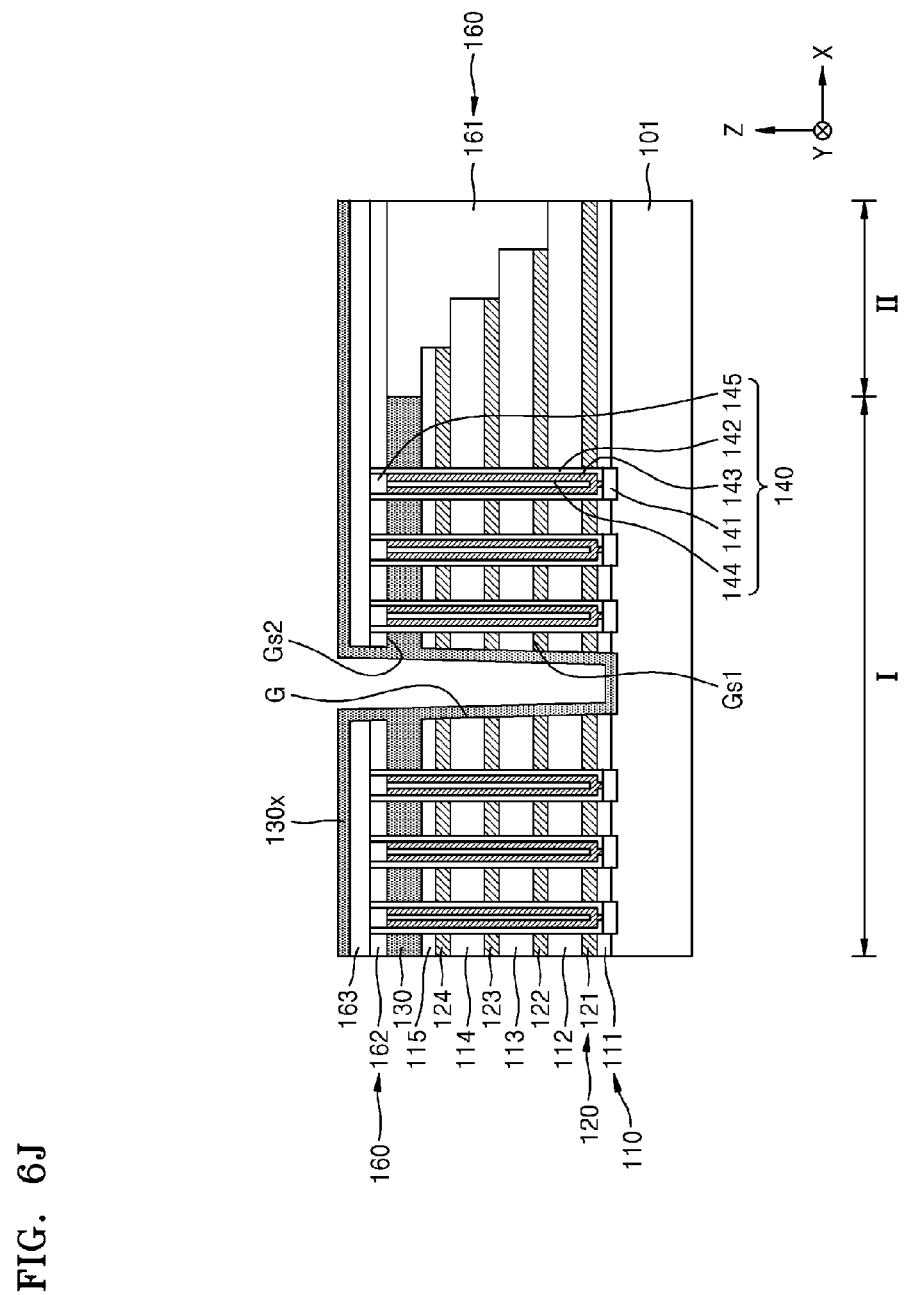

Referring to FIG. 6J, a blocking layer 130x may be formed on the third upper insulating layer 163, the opening G, and the second side opening Gs2. The blocking layer 130x may include, for example, aluminum oxide, hafnium oxide, silicon nitride, boron nitride, or silicon carbide.

In example embodiments, the second side opening Gs2 may be completely filled with the blocking layer 130x.

Figure 6K:
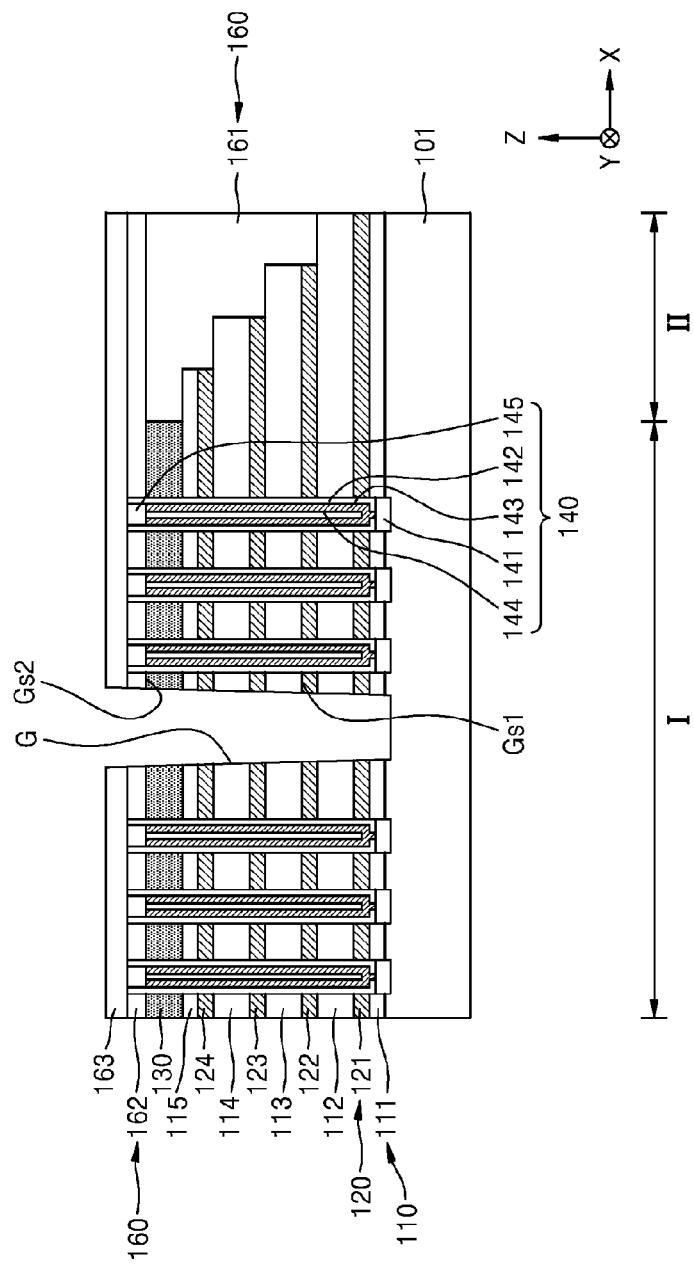

Referring to FIG. 6K, the blocking layer 130x, except for the blocking layer 130x formed in a region of the second side opening Gs2, may be removed. That is, the blocking layer 130x formed on a top surface of the third upper insulating layer 163 and in the opening G may be removed to form a blocking layer 130.

A process of forming the blocking layer 130 may be, for example, an etching process. For instance, the process of forming the blocking layer 130 may be a wet etching process using an etchant having a relatively high etch selectivity with respect to the blocking layer 130x and having a relatively low etch selectivity with respect to the insulating layers, namely, the insulating layers 110 and the upper insulating layers 160, and the gate electrodes 120.

Figure 6L:
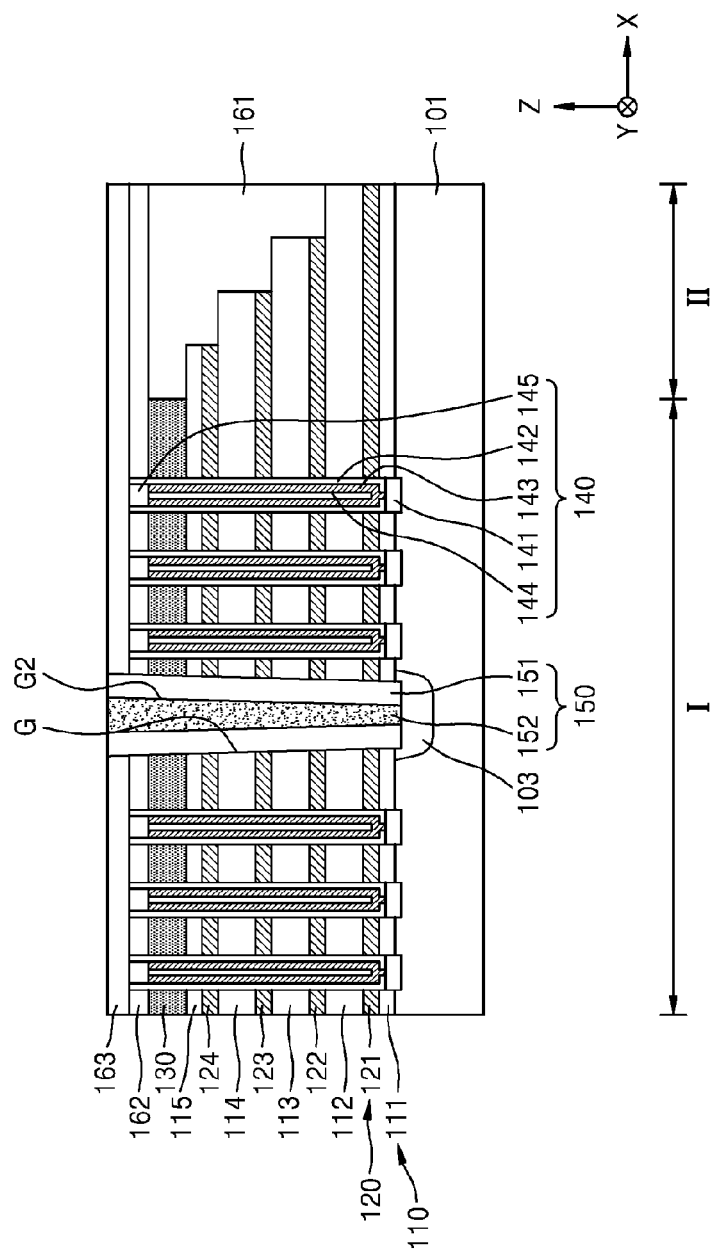

Referring to FIG. 6L, impurities may be implanted into a portion of the substrate 101 that is exposed by the opening G to form a common source region 103.

Thereafter, an insulating layer (not shown) may be formed on a top surface of the third upper insulating layer 163 and an inner wall of the opening G, and an anisotropic etching process may be performed on the insulating layer to form common source line spacers 151 on sidewalls of the opening G. The common source line spacers 151 may be formed using, for example, silicon nitride, silicon oxynitride, or silicon oxide.

A second opening G2 formed by the common source line spacers 151 may be filled with a conductive material (not shown), such as tungsten, tantalum, cobalt, tungsten silicide, tantalum silicide, or cobalt silicide. A planarization process may be performed on the conductive material until the top surface of the third upper insulating layer 163 is exposed, thereby forming a common source line 152.

The common source line spacers 151 and the common source line 152 may constitute a common source line structure 150, and the common source line 152 may be connected to the common source region 103.

Figure 6M:
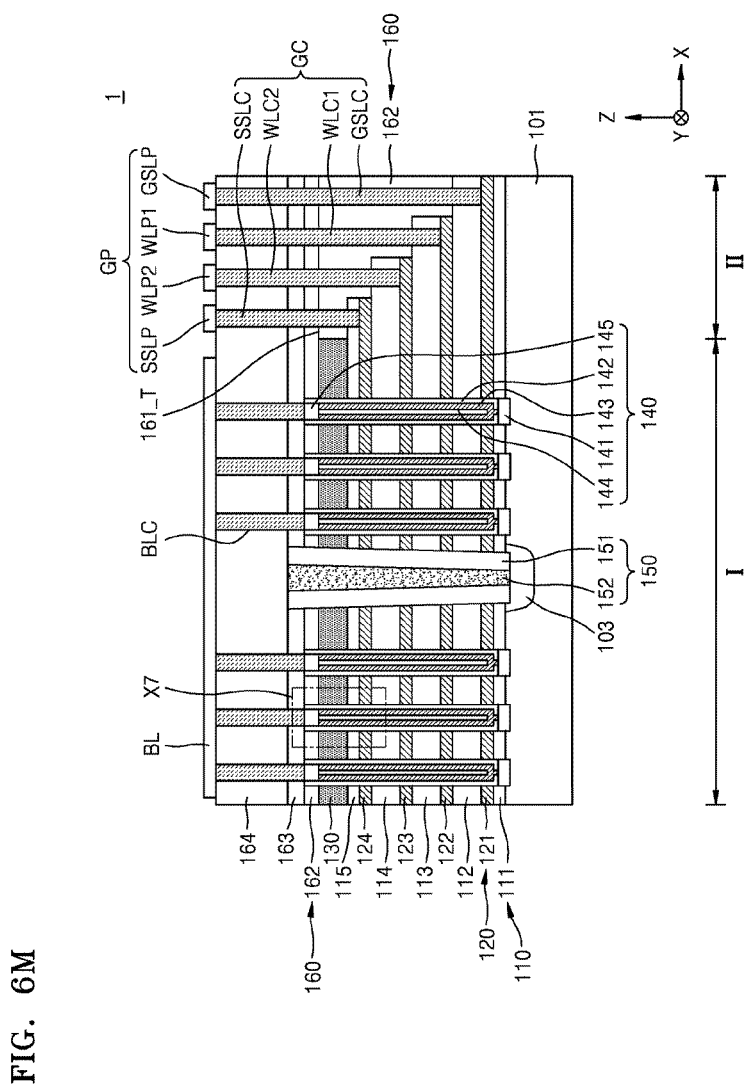

Referring to FIG. 6M, a fourth upper insulating layer 164 may be formed to cover the top surface of the third upper insulating layer 163 and a top surface of the common source line structure 150. Together, the third upper insulating layer 163 and the fourth upper insulating layer 164 may be referred to as an upper insulating structure.

Thereafter, photolithography and etching processes may be performed. Thus, a bit line contact hole may be formed in the third and fourth upper insulating layers 163 and 164 disposed in the cell area I, and a ground selection line contact hole exposing a first gate electrode 121, word line contact holes exposing second and third gate electrodes 122 and 123, and a string selection line contact hole exposing a fourth gate electrode 124 may be formed in the third and fourth upper insulating layers 163 and 164 disposed in the connection area II.

The bit line contact hole, the string selection line contact hole, the word line contact holes, and the ground selection line contact hole may be filled with a conductive material (not shown), and the conductive material may be planarized until a top surface of the fourth upper insulating layer 164 is exposed. Thus, a bit line contact BLC, a string selection line contact SSLC, word line contacts WLC1 and WLC2, and a ground selection line contact GSLC may be formed.

Bit lines BL may be formed on the fourth upper insulating layer 164 disposed in the cell area I. Each of the bit lines BL may be connected to the bit line contact BLC, extend in the first direction (X-axial direction), and disposed apart from and parallel to one another in the second direction (Y-axial direction).

A string selection line pad SSLP, first and second word line pads WLP1 and WLP2, and a ground selection line pad GSLP may be formed on the fourth upper insulating layer 164 disposed in the connection area II and connected to the string selection line contact SSLC, the word line contacts WLC1 and WLC2, and the ground selection line contact GSLC, respectively, thereby completing formation of a memory device 1.

Figure 7A:
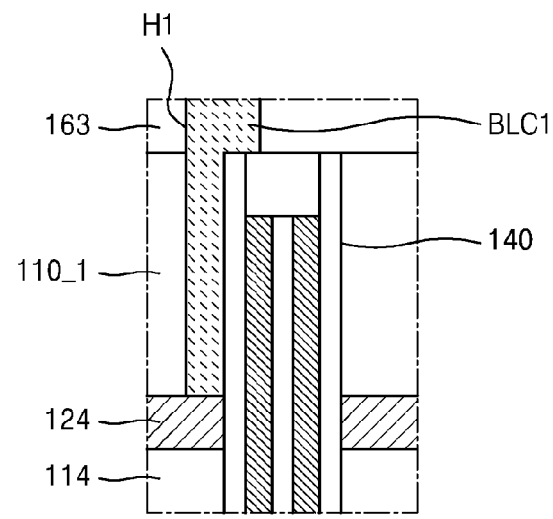
FIGS. 7A and 7B are diagrams for explaining examples of functions of a blocking layer according to example embodiments of inventive concepts.
Figure 7B:
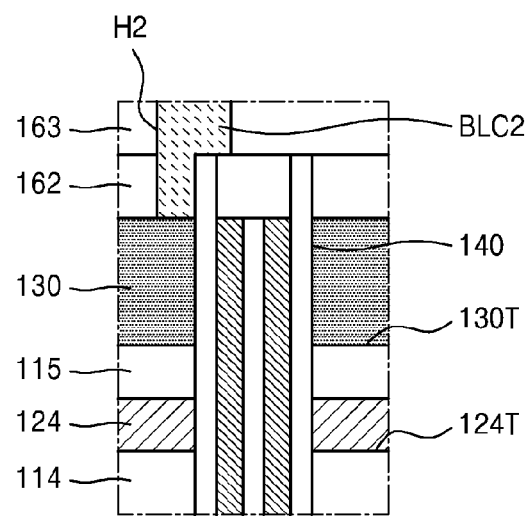

FIGS. 7A and 7B are diagrams for explaining examples of functions of a blocking layer 130 according to example embodiments of inventive concepts.

FIGS. 7A and 7B are partial enlarged views of a region corresponding to a region X7 of FIG. 6M when a misalignment occurs during a process of forming bit line contact holes H1 and H2.

Referring to FIG. 7A, the blocking layer 130 may not be provided on an insulating layer 110_1 formed on a fourth gate electrode 124. In this case, as shown in FIG. 7A, when a misalignment occurs during a process of etching a third upper insulating layer 163 to form a bit line contact hole H1 in which a bit line contact BLC1 is disposed, the etching process may be performed to expose a top surface 124_T of the fourth gate electrode 124 so that an electrical short may occur between the bit line contact BLC1 and the fourth gate electrode 124.

Referring to FIG. 7B, the blocking layer 130 may be provided on the fourth gate electrode 124 between a fifth insulating layer 115 and a second upper insulating layer 162. In this case, unlike in the case of FIG. 7A, even if a misalignment occurs during a process of etching the third upper insulating layer 163 for forming the bit line contact hole H2 in which the bit line contact BLC2 is disposed, the etching process may be performed not to expose the top surface 124_T of the fourth gate electrode 124 but to expose a top surface 130_T of the blocking layer 130. That is, occurrence of an electrical short between the bit line contact BLC2 and the fourth gate electrode 124 may be limited and/or prevented.

FIGS. 8A to 8I are cross-sectional views illustrating processes of a method of fabricating a memory device, according to example embodiments of inventive concepts. In FIGS. 8A to 8I, the same reference numerals are used to denote the same elements as in FIGS. 2A to 6M, and repeated descriptions thereof are omitted for brevity.

Figure 8A:
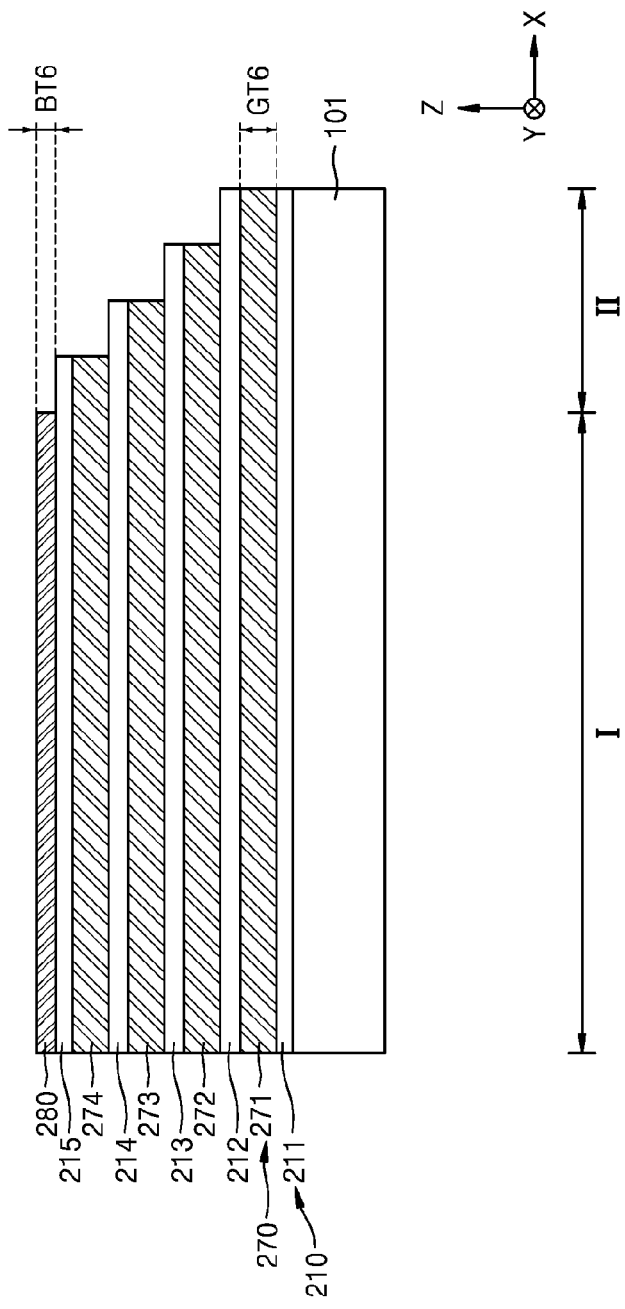
FIGS. 8A to 8I are cross-sectional views illustrating processes of a method of fabricating a memory device, according to example embodiments of inventive concepts.

Referring to FIG. 8A, insulating layers (211, 212, 213, 214, and 215:210), gate sacrificial layers (271, 272, 273, and 274:270), and a blocking sacrificial layer 280 having step differences, as shown in FIG. 8A, may be formed on a substrate 101.

Processes of forming the insulating layers 210, the gate sacrificial layers 270, and the blocking sacrificial layer 280 may be similar to the processes of forming the insulating layers 110, the gate sacrificial layers 170, and the blocking sacrificial layer 180 as described above with reference to FIGS. 6A and 6B.

However, thicknesses of the insulating layers 210, the gate sacrificial layers 270, and the blocking sacrificial layer 280 obtained in the third direction (Z-axial direction) may be respectively different from thicknesses of the insulating layers 110, the gate sacrificial layers 170, and the blocking sacrificial layer 180 obtained in the third direction (Z-axial direction) as described with reference to FIGS. 6A and 6B. Also, the blocking sacrificial layer 280 may be formed of different materials from the blocking sacrificial layer 180 described with reference to FIGS. 6A and 6B.

Specifically, a thickness BT6 of the blocking sacrificial layer 280 obtained in the third direction (Z-axial direction) may be smaller than a thickness GT6 of each of the gate sacrificial layers 270 obtained in the third direction (Z-axial direction). Alternatively, the thickness BT6 of the blocking sacrificial layer 280 obtained in the third direction (Z-axial direction) may be substantially equal to the thickness GT6 of each of the gate sacrificial layers 270 obtained in the third direction (Z-axial direction).

The blocking sacrificial layer 280 may be formed of a material having a high etch selectivity with respect to the insulating layers 210 and the gate sacrificial layers 270. For example, the insulating layers 210 may be formed of silicon oxide, the gate sacrificial layers 270 may be formed of aluminum oxide, and the blocking sacrificial layer 280 may be formed of poly-Si or silicon germanium.

Figure 8B:
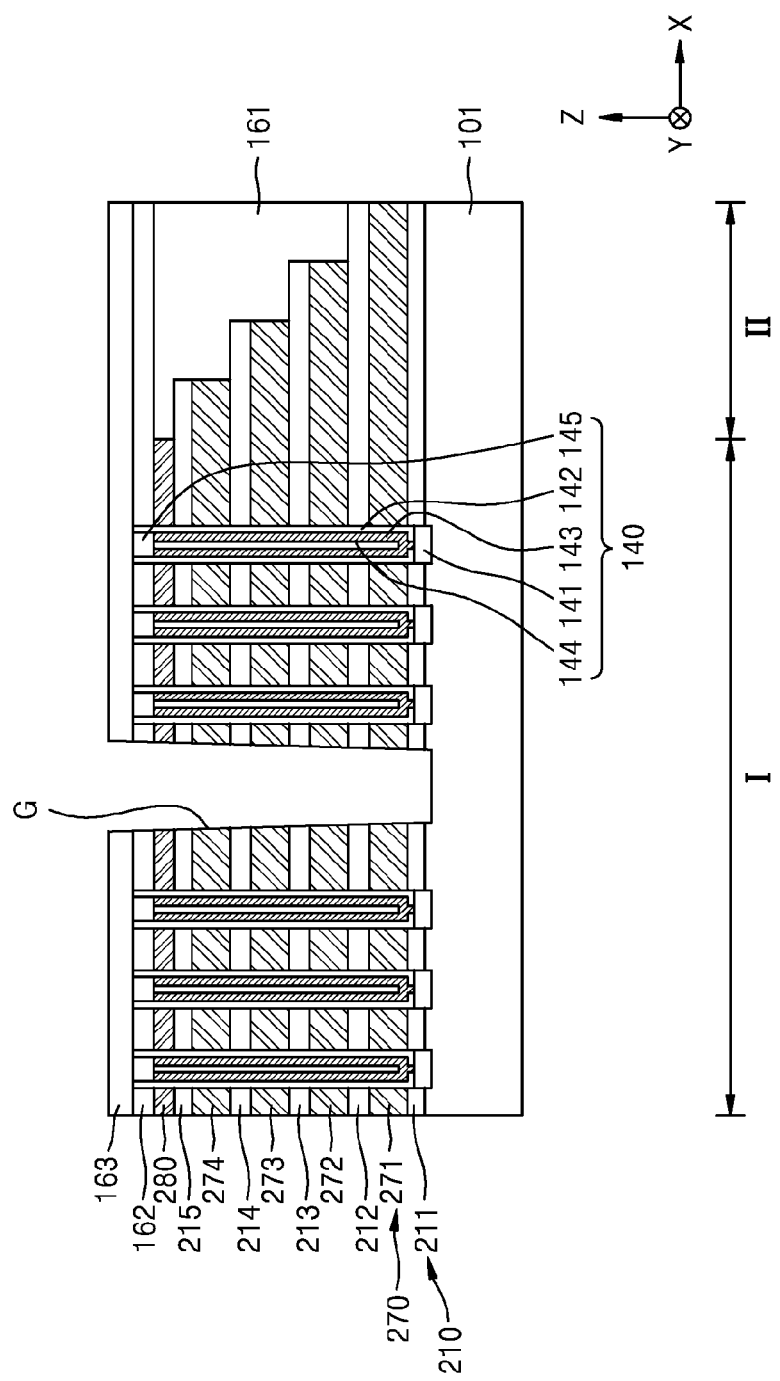

Referring to FIG. 8B, similar to the processes described above with reference to FIGS. 6C to 6F, upper insulating layers 161, 162, and 163, a channel structure 140, and an opening G may be formed.

Figure 8C:
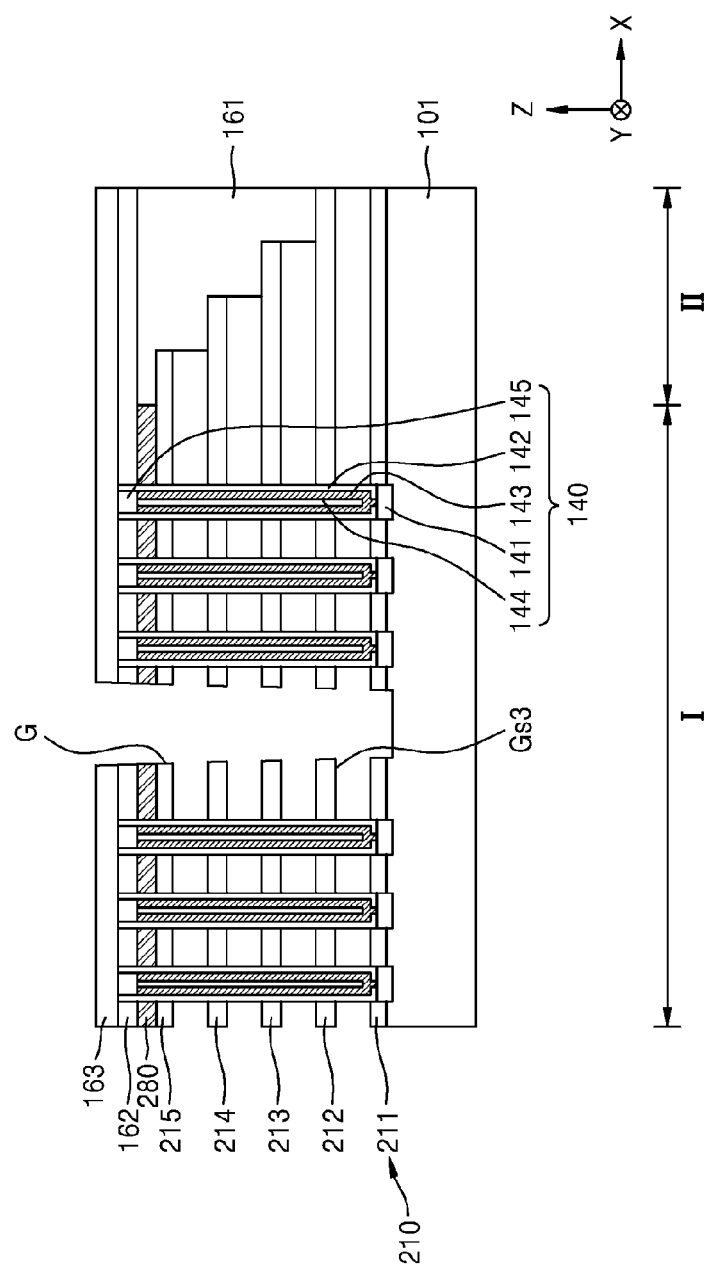

Referring to FIG. 8C, the gate sacrificial layers 270 exposed by the opening G may be removed to form third side openings Gs3.

A process of forming the third side openings Gs3 may be a wet etching process using an etchant having an etch selectivity with respect to the gate sacrificial layers 270. Since the gate sacrificial layers 270 has a high etch selectivity with respect to the blocking sacrificial layer 280. The blocking sacrificial layer 280 may not be removed during the removal of the gate sacrificial layers 270.

Figure 8D:
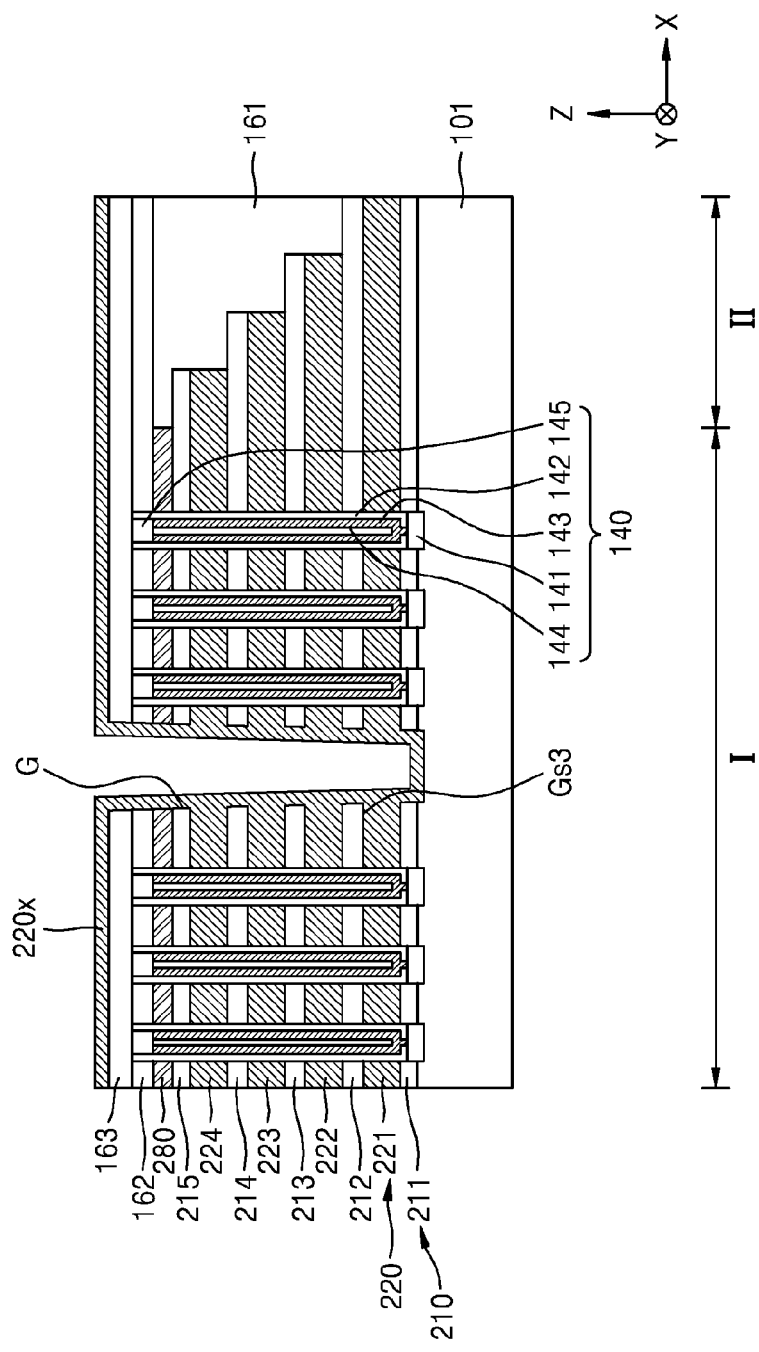

Referring to FIG. 8D, a conductive material 220x may be formed on a third upper insulating layer 163 and in the opening G and the third side openings Gs3. The conductive material 220x may be a metal, for example, tungsten. The third side openings Gs3 may be completely filled with the conductive material 220x.

Figure 8E:
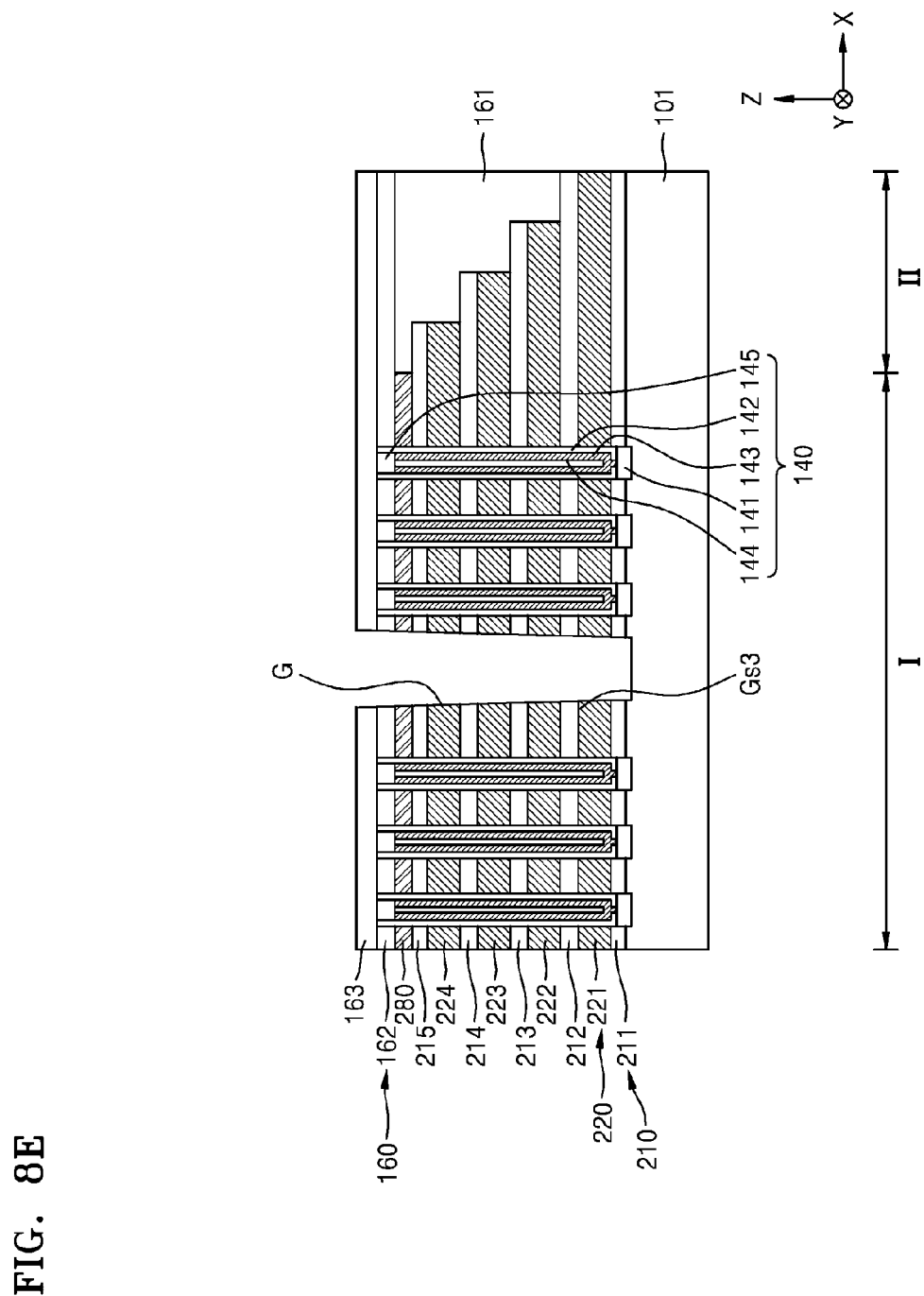

Referring to FIG. 8E, the conductive material 220x, except for the conductive material 220x formed in a region of the third side openings Gs3, may be removed. That is, the conductive material 220x, which is formed on a top surface of the third upper insulating layer 163 and in the opening G, may be removed to form gate electrodes 220. A process of forming the gate electrodes 220 may be, for example, an etching process.

In example embodiments, the process of forming the gate electrodes 220 may be a wet etching process using an etchant having a relatively high etch selectivity with respect to the conductive material 220x and having a relatively low etch selectivity with respect to the insulating layers 210 and 160.

Figure 8F:
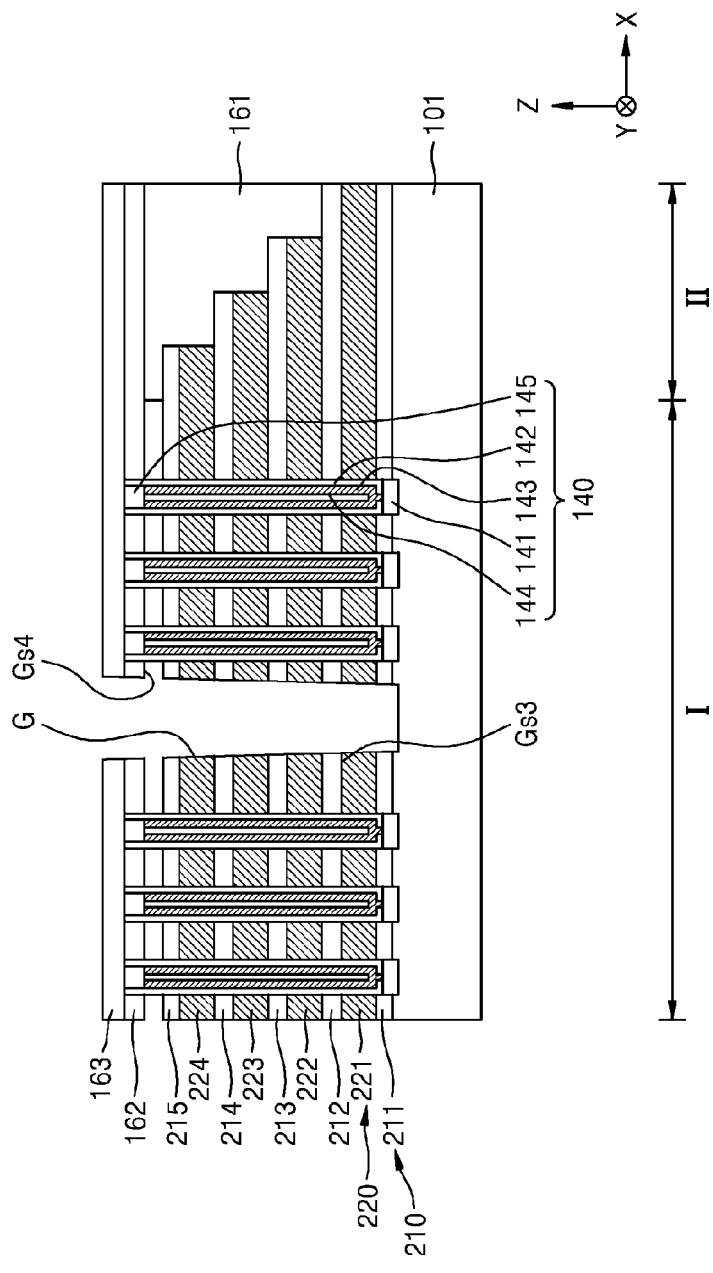

Referring to FIG. 8F, the blocking sacrificial layer 280 may be removed to form a fourth side opening Gs4.

For example, the process of forming the fourth side opening Gs4 may be a wet etching process using an etchant having a relatively high etch selectivity with respect to the blocking sacrificial layer 280 and having a relatively low etch selectivity with respect to the insulating layers 210 and 160 and the gate electrodes 220.

Figure 8G:
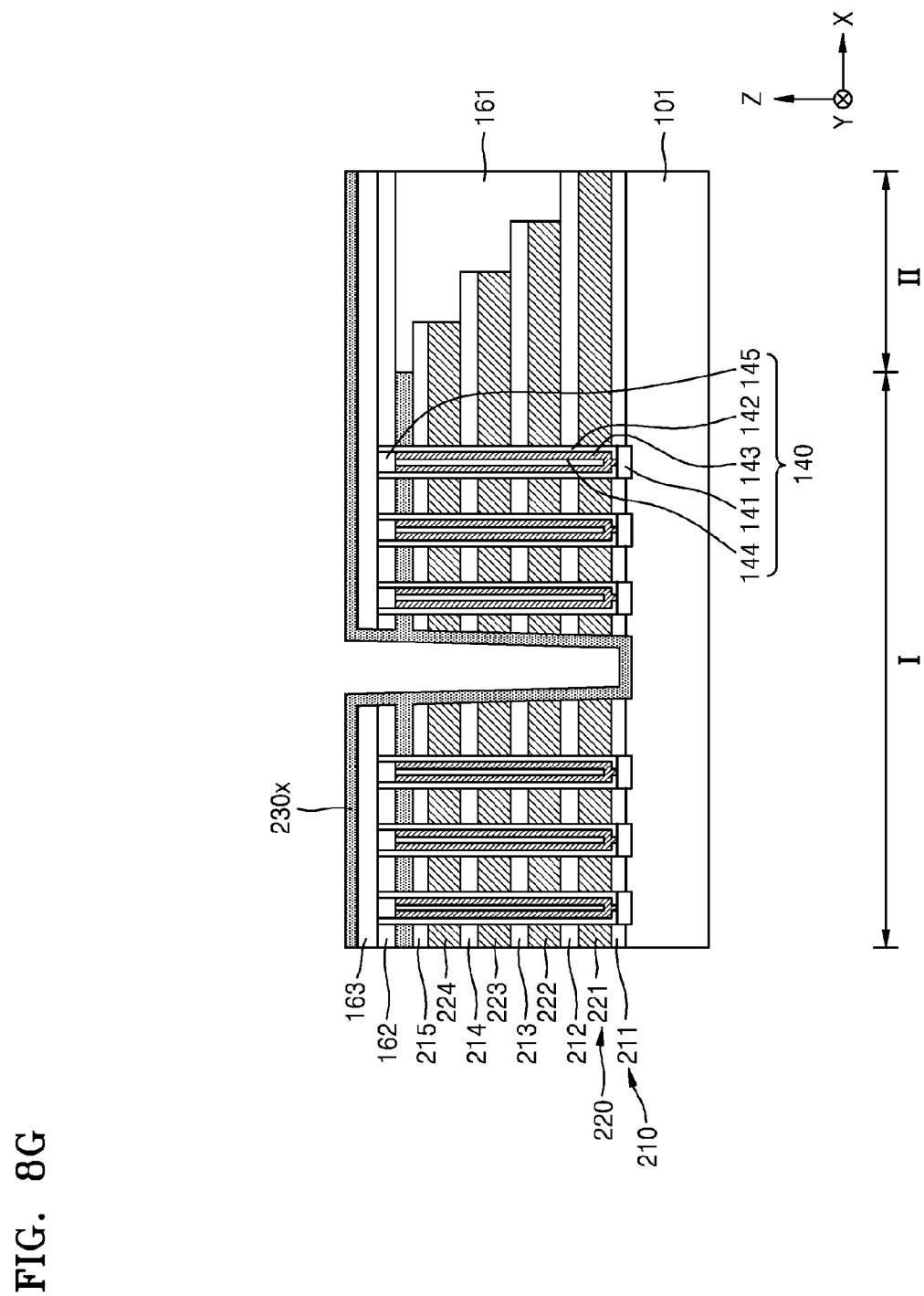

Referring to FIG. 8G, a blocking layer 230x may be formed on the third upper insulating layer 163, the opening G, and the fourth side opening Gs4. The blocking layer 230x may include, for example, aluminum oxide, hafnium oxide, silicon nitride, boron nitride, or silicon carbide.

In example embodiments, the fourth side opening Gs4 may be completely filled with the blocking layer 230x.

Figure 8H:
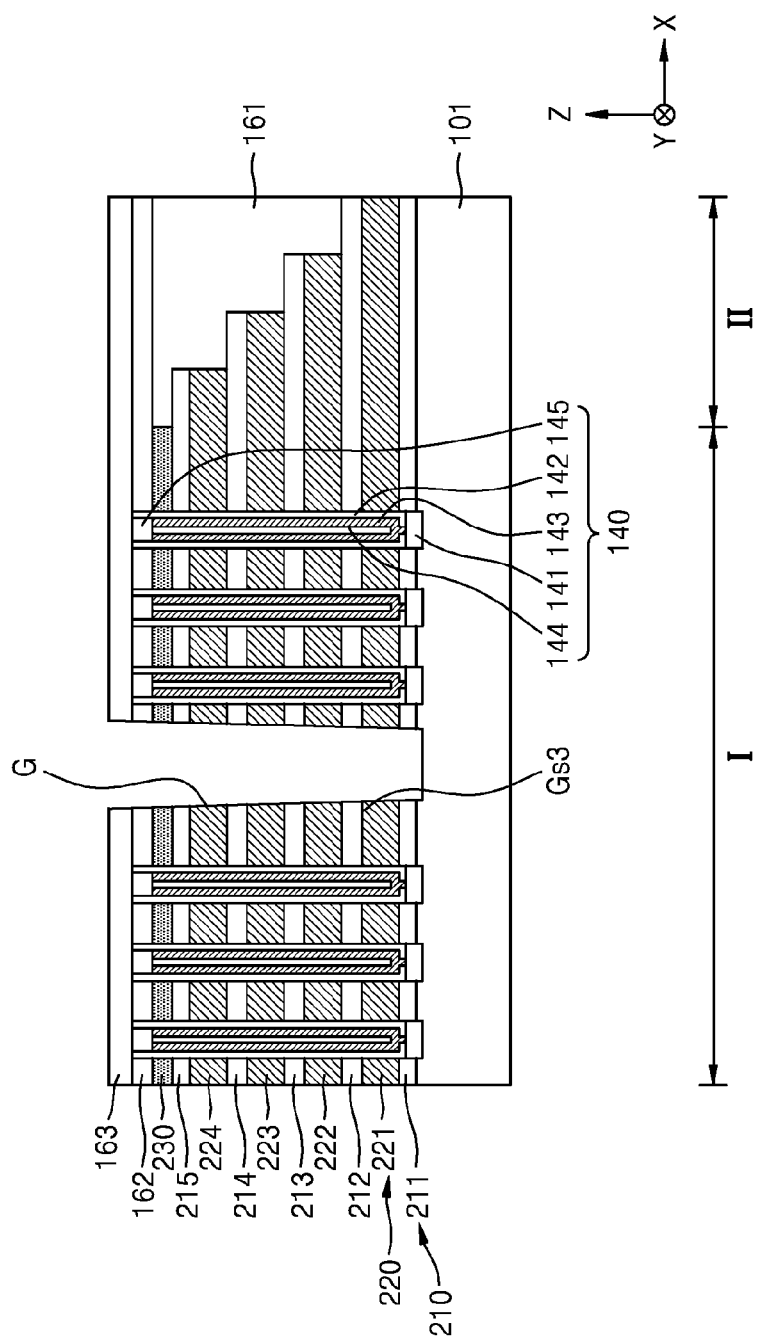

Referring to FIG. 8H, the blocking layer 230x, except for the blocking layer 230x formed in a region of the fourth side opening Gs4, may be removed. That is, the blocking layer 230x formed on the top surface of the third upper insulating layer 163 and in the opening G may be removed to form a blocking layer 230.

A process of forming the blocking layer 230 may be, for example, an etching process. For instance, the process of forming the blocking layer 230 may be a wet etching process using an etchant having a relatively high etch selectivity with respect to the blocking layer 230x and having a relatively low etch selectivity with respect to the insulating layers 210 and 160 and the gate electrodes 220.

Figure 8I:
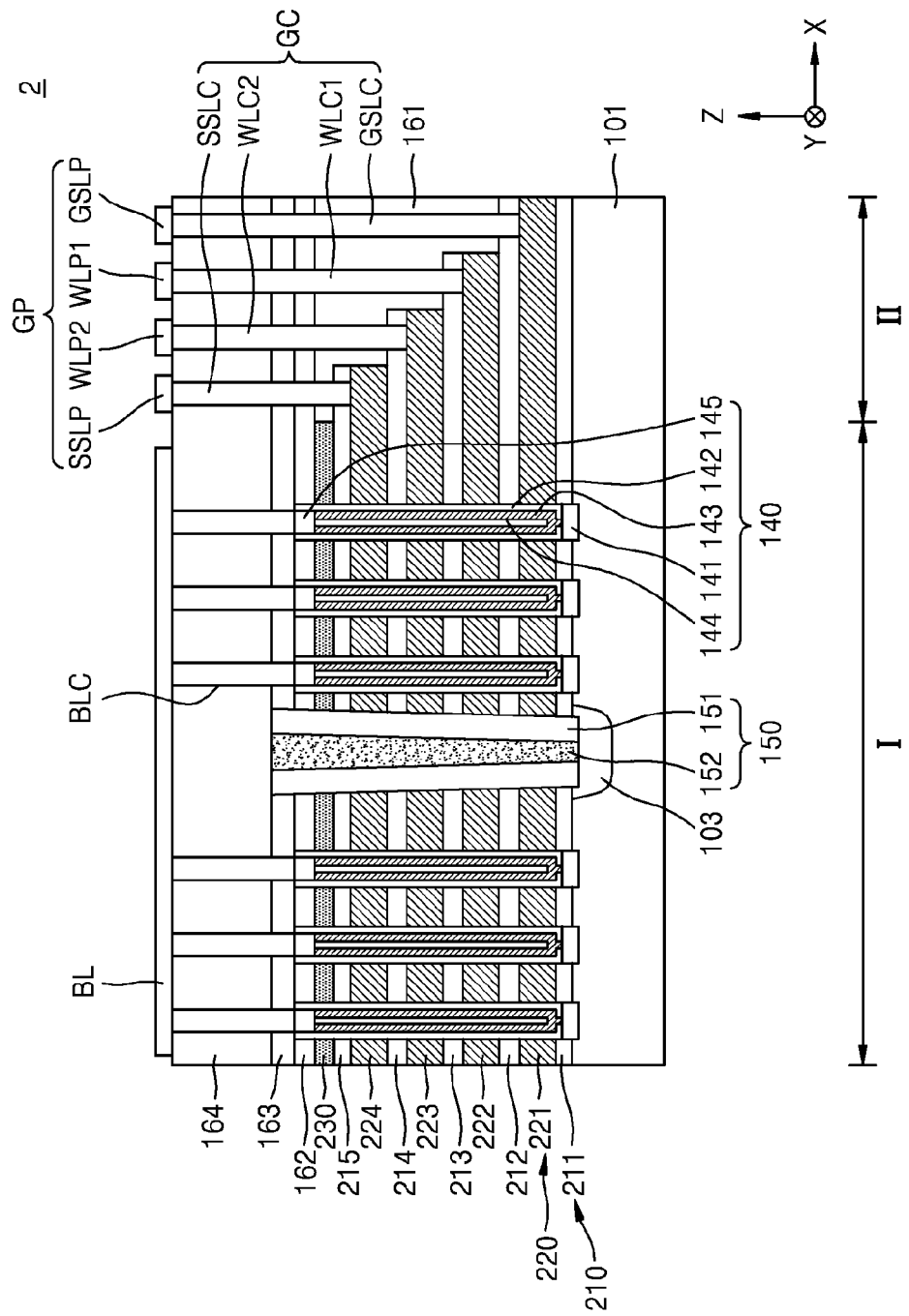

Referring to FIG. 8I, similar to the processes described above with reference to FIGS. 6L and 6M, a common source region 103, a common source line structure 150, a fourth upper insulating layer 164, a bit line contact BLC, a string selection line contact SSLC, word line contacts WLC1 and WLC2, and a ground selection line contact GSLC, a bit line BL, a string selection line pad SSLP, first and second word line pads WLP1 and WLP2, and a ground selection line pad GSLP may be formed, thereby completing formation of a memory device 2.

Figure 9:
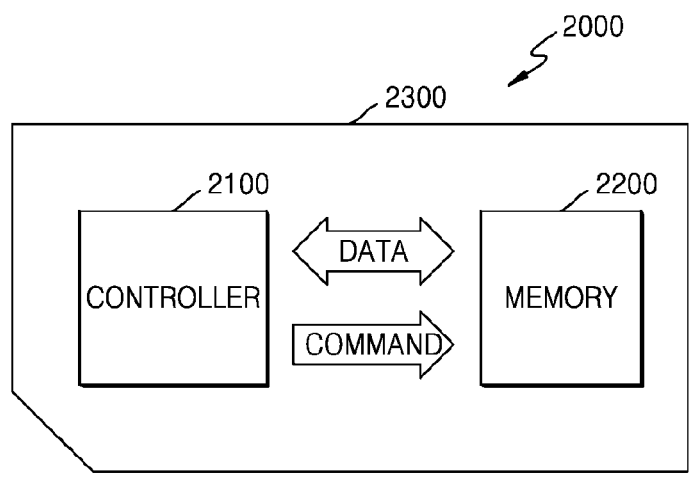
FIG. 9 is a schematic diagram of a memory card according to example embodiments of inventive concepts.

FIG. 9 is a schematic diagram of a memory card 2000 according to example embodiments of inventive concepts.

Referring to FIG. 9, the memory card 2000 may include a controller 2100 and a memory 2200, which may be embedded in a housing 2300. The controller 2100 and the memory 2200 may exchange electric signals. For example, the memory 2200 and the controller 2100 may exchange data in response to a command of the controller 2100. Thus, the memory card 2000 may store data in the memory 2200 or externally output data from the memory 2200.

For example, the memory 2200 may include a memory device similar to the memory devices 1, 2, 3, and 4 described with reference to FIGS. 1 to 8I. The memory card 2000 may be used as a data storage medium for various portable devices. For example, the memory card 2000 may include a multimedia card (MMC) or a secure digital (SD) card.

Figure 10:
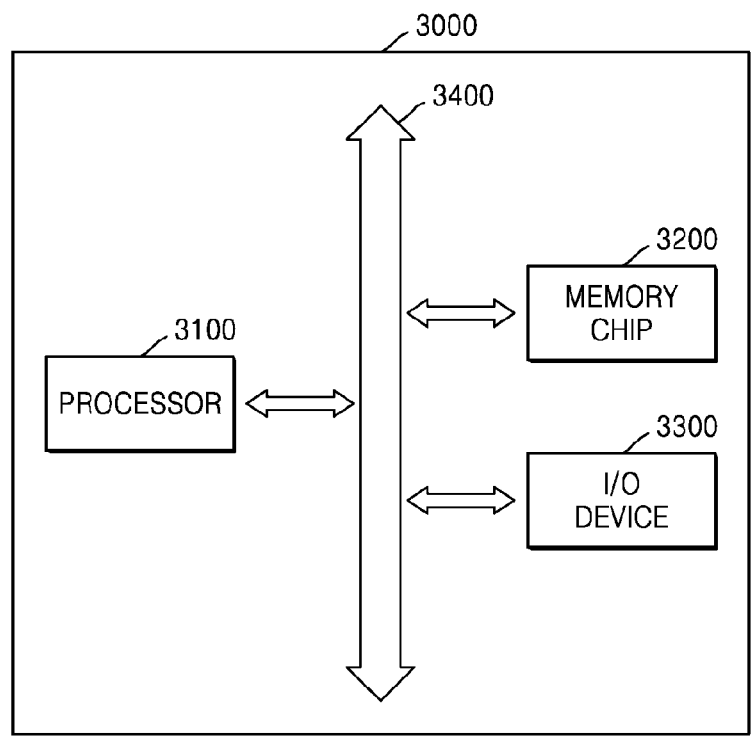
FIG. 10 is a block diagram of an electronic system according to example embodiments of inventive concepts.

FIG. 10 is a block diagram of an electronic system 3000 according to example embodiments of inventive concepts.

Referring to FIG. 10, the electronic system 3000 may include a processor 3100, an input/output (I/O) device 3300, and a memory chip 3200, which may communicate data with one another using a bus 3400. The processor 3100 may execute a program, and control the electronic system 3000. The I/O device 3300 may be used to input or output data of the electronic system 3000. The electronic system 3000 may be connected to an external device (e.g., a personal computer or a network) using the I/O device 3300 and exchange data with the external device. The memory chip 3200 may store codes and data for operations of the processor 3100. For example, the memory chip 3200 may include a memory device similar to the memory devices 1, 2, 3, and 4 described with reference to FIGS. 1 to 8I.

The electronic system 3000 may constitute various electronic control devices that need the memory chip 3200. For example, the electronic system 3000 may be used for a mobile phone, an MPEG-1 audio layer 3 (MP3) player, a navigation, a solid-state disk (SSD), or household appliances.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of fabricating a memory device, the method comprising:
   alternately stacking a plurality of insulating layers and a plurality of sacrificial layers on a substrate, the sacrificial layers including first sacrificial layers and a second sacrificial layer, the second sacrificial layer being on an uppermost first sacrificial layer of the first sacrificial layers, a thickness of the second sacrificial layer in a first direction being greater than a thickness of each of the first sacrificial layers in the first direction;
   forming a channel hole by etching the insulating layers and the sacrificial layers, the channel hole exposing a partial region of the substrate;
   forming a channel structure in the channel hole;
   forming an opening by etching the insulating layers and the sacrificial layers, the opening exposing a portion of the substrate;
   forming a plurality of side openings by removing the sacrificial layers through the opening, the side openings including first side openings and a second side opening;
   forming gate electrodes that fill the first side openings; and
   forming a blocking layer that fills the second side opening, wherein at least one of the insulating layers is interposed between the blocking layer and the gate electrodes.

2. The method of claim 1, wherein
   a thickness of the blocking layer is greater than a thickness of each of the gate electrodes in the first direction, and
   the first direction is perpendicular to a top surface of the substrate.

3. The method of claim 1, further comprising:
   forming an upper insulating structure to cover a top surface of an uppermost insulating layer of the insulating layers and a top surface of the channel structure;
   forming a bit line contact that is connected to the channel structure through the upper insulating structure; and
   forming a bit line on the upper insulating structure, wherein the bit line is connect to the bit line contact.

4. The method of claim 3, wherein a top surface of the blocking layer is at a lower level than a bottom surface of the bit line contact.

5. The method of claim 3, wherein the blocking layer has a high etch selectivity with respect to the insulating layers and the upper insulating structure.

6. The method of claim 1, further comprising:
   forming gate contacts that are connected to the gate electrodes, respectively.

7. The method of claim 6, wherein the gate contacts are spaced apart from the blocking layer.

8. The method of claim 6, wherein
   the gate contacts include a string selection line contact, a word line contact, and a ground selection line contact,
   the string selection line contact is in contact with the blocking layer, and
   the word line contact and the ground selection line contact are spaced apart from the blocking layer.

9. The method of claim 1, further comprising:
   forming a common source line structure that fills the opening.

10. A method of fabricating a memory device, the method comprising:
    forming a stack structure on a substrate, the stack structure including a plurality of first sacrificial layers respectively interposed between a plurality of insulating layers;
    forming a second sacrificial layer on a top insulating layer among the insulating layers, the top insulating layer at a top portion of the stack structure;
    forming a channel hole by etching the insulating layers, the first sacrificial layers, and the second sacrificial layer, the channel hole exposing a partial region of the substrate;
    forming a channel structure in the channel hole;
    forming an opening by etching the insulating layers, the first sacrificial layers, and the second sacrificial layer, the opening exposing a portion of the substrate;
    forming first side openings by removing the first sacrificial layers through the opening;
    forming gate electrodes that fill the first side openings;
    forming a second side opening by removing the second sacrificial layer; and
    forming a blocking layer that fills the second side opening, wherein the blocking layer extends over an uppermost one of the gate electrodes, and the second sacrificial layer has a high etch selectivity with respect to the first sacrificial layers.

11. The method of claim 10, wherein
    the second sacrificial layer has a high etch selectivity with respect to the gate electrodes.

12. The method of claim 10, wherein
    a thickness of the second sacrificial layer in a first direction is smaller than a thickness of each of the first sacrificial layers in the first direction, and the first direction is perpendicular to a top surface of the substrate.

13. The method of claim 10, wherein
    a thickness of the blocking layer in a first direction is smaller than a thickness of each of the gate electrodes in the first direction, and the first direction is perpendicular to a top surface of the substrate.

* * * * *